United States Patent
Tsuji

(10) Patent No.: US 7,567,602 B2
(45) Date of Patent: Jul. 28, 2009

(54) OPTICAL PICKUP DEVICE, SEMICONDUCTOR LASER DEVICE AND HOUSING USABLE FOR THE OPTICAL PICKUP DEVICE, AND METHOD OF MANUFACTURING SEMICONDUCTOR LASER DEVICE

(75) Inventor: Makoto Tsuji, Higashihiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 120 days.

(21) Appl. No.: 11/812,715

(22) Filed: Jun. 21, 2007

(65) Prior Publication Data

US 2007/0248133 A1 Oct. 25, 2007

Related U.S. Application Data

(62) Division of application No. 11/090,182, filed on Mar. 28, 2005.

(30) Foreign Application Priority Data

| Mar. 30, 2004 | (JP) | ............................. 2004-098613 |
| Apr. 23, 2004 | (JP) | ............................. 2004-127635 |
| Jun. 24, 2004 | (JP) | ............................. 2004-186259 |
| Jun. 30, 2004 | (JP) | ............................. 2004-192960 |
| Jun. 30, 2004 | (JP) | ............................. 2004-193503 |
| Jan. 20, 2005 | (JP) | ............................. 2005-012554 |

(51) Int. Cl.
*H01S 5/00* (2006.01)

(52) U.S. Cl. .......................... 372/44.01; 372/34; 372/36; 372/43.01

(58) Field of Classification Search .................. 372/36, 372/50.11, 43.01, 44.01
See application file for complete search history.

(56) References Cited

U.S. PATENT DOCUMENTS

| 5,727,009 | A | * | 3/1998 | Tajiri et al. ................ 372/50.11 |
| 7,050,477 | B2 | | 5/2006 | Komoto |
| 2003/0231672 | A1 | * | 12/2003 | Komoto ........................ 372/36 |

FOREIGN PATENT DOCUMENTS

| CN | 1449079 A | 10/2003 |
| JP | 6-45709 | 2/1994 |
| JP | 2001-308437 | 11/2001 |
| JP | 2001-332799 | 11/2001 |
| JP | 2002-43679 | 2/2002 |
| JP | 2002-298397 | 10/2002 |
| JP | 2003-31885 | 1/2003 |

* cited by examiner

*Primary Examiner*—Minsun Harvey
*Assistant Examiner*—Yuanda Zhang
(74) *Attorney, Agent, or Firm*—Nixon & Vanderhye, PC

(57) ABSTRACT

A semiconductor laser device includes a first lead having a plate-like mounting portion on which a semiconductor laser chip is mounted and a lead portion extending from the mounting portion, a second lead extending along the lead portion of the first lead, and a retention portion made of an insulative material that integrally retains the first lead and the second lead. The mounting portion of the first lead has a back surface exposed from the retention portion, and the first lead further has a tie bar portion projecting from the mounting portion along the back surface of the mounting portion.

11 Claims, 28 Drawing Sheets

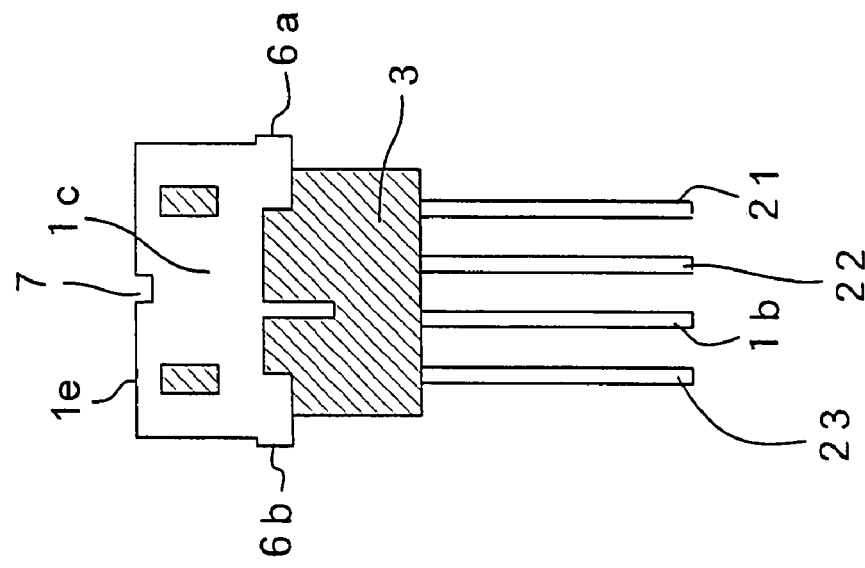
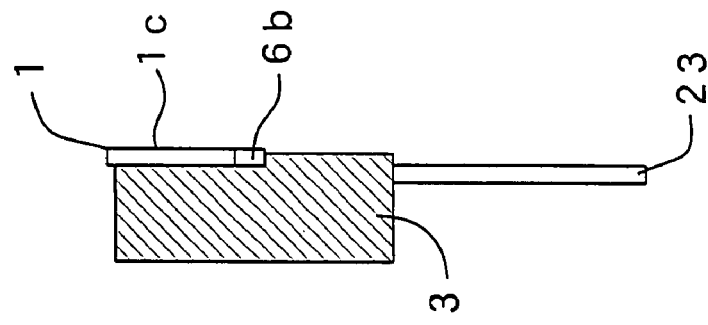
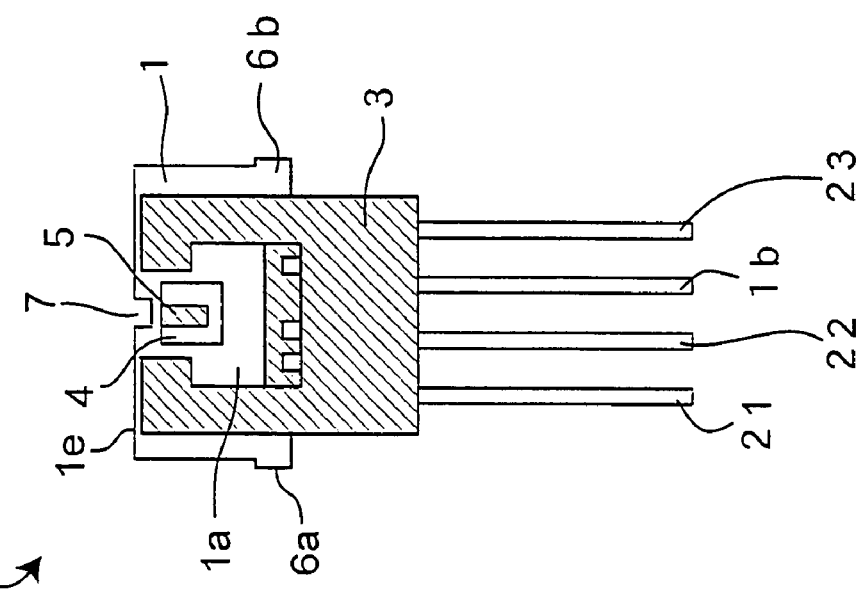

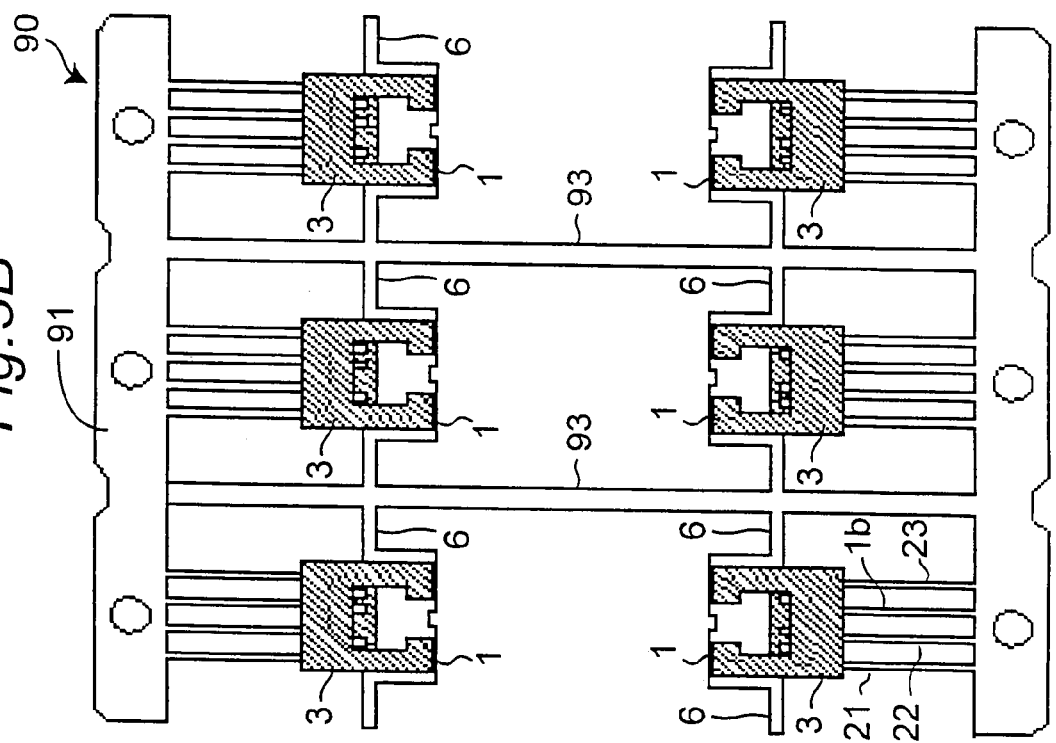
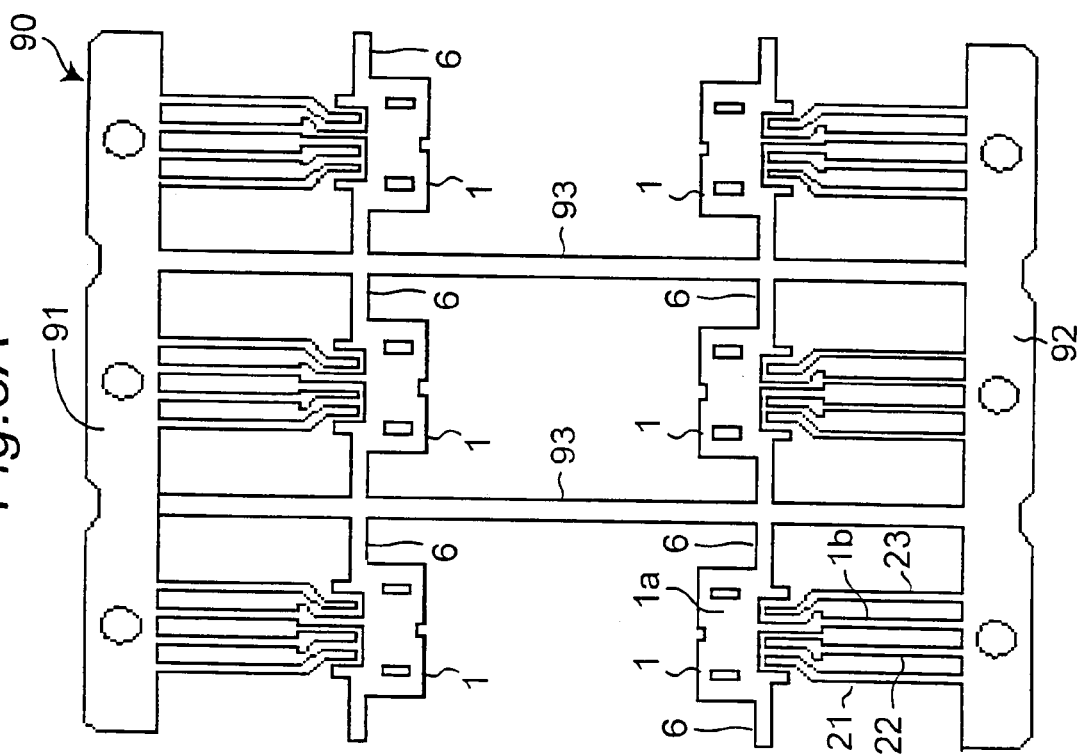

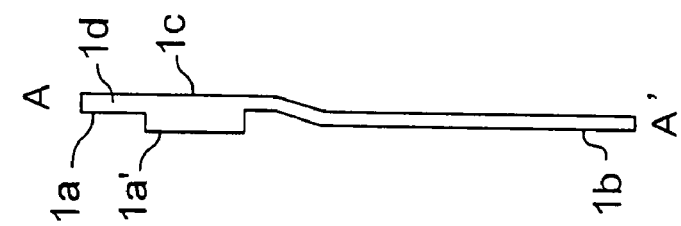
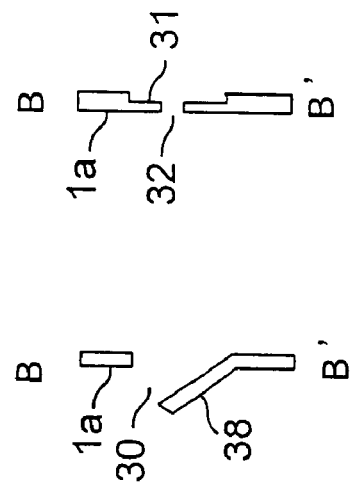
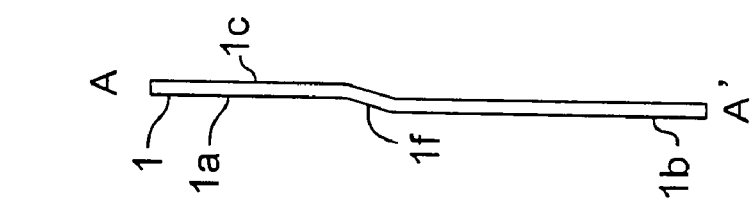
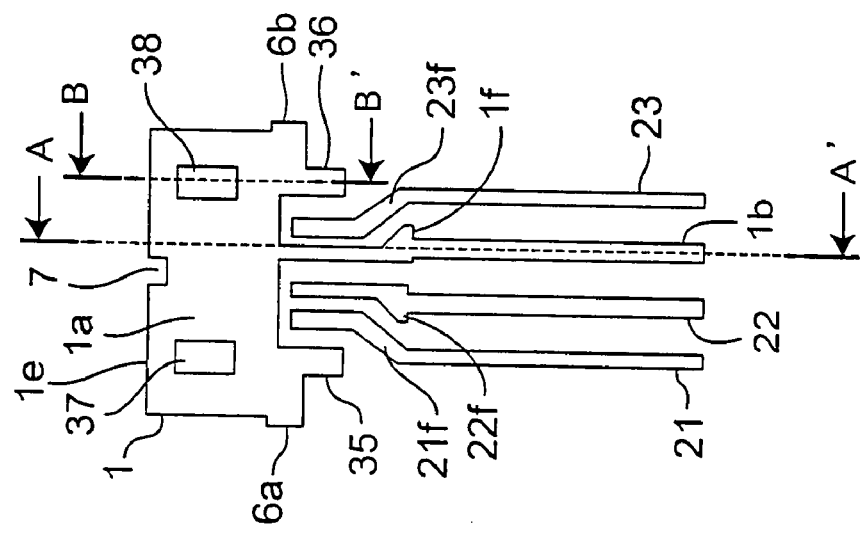

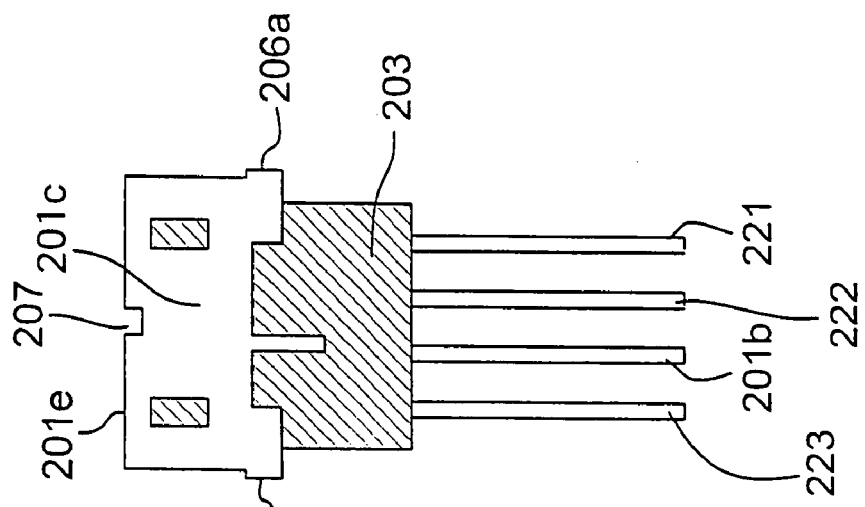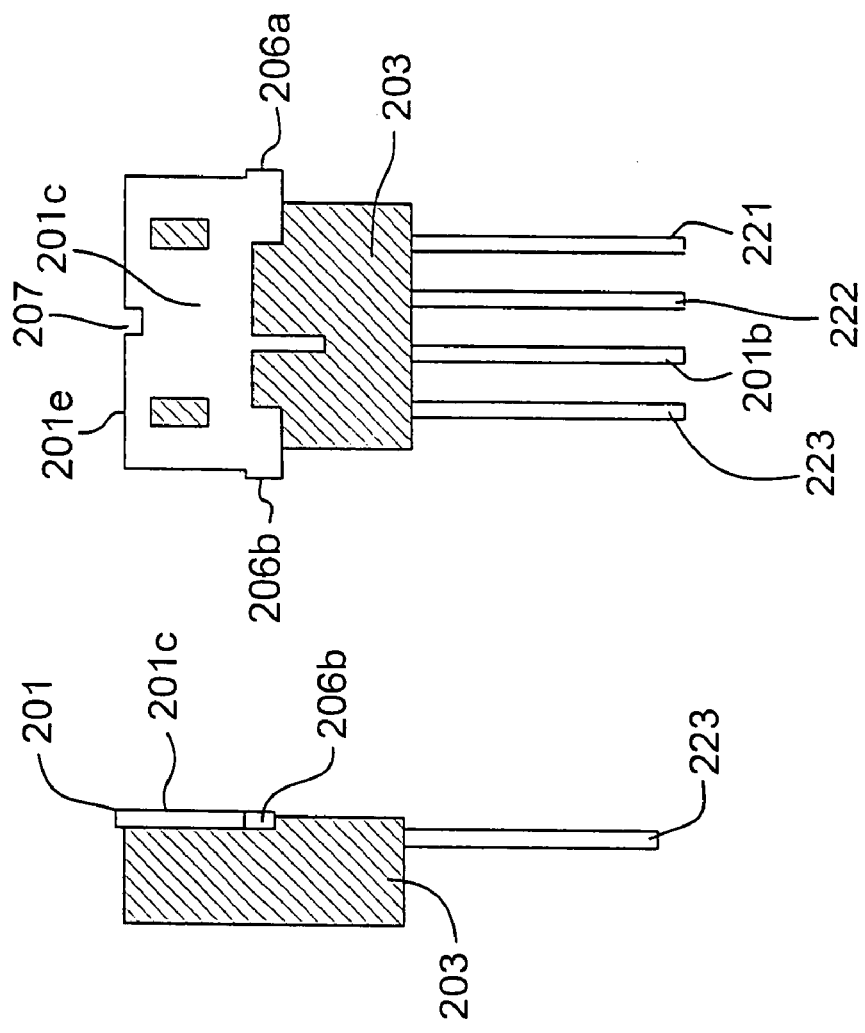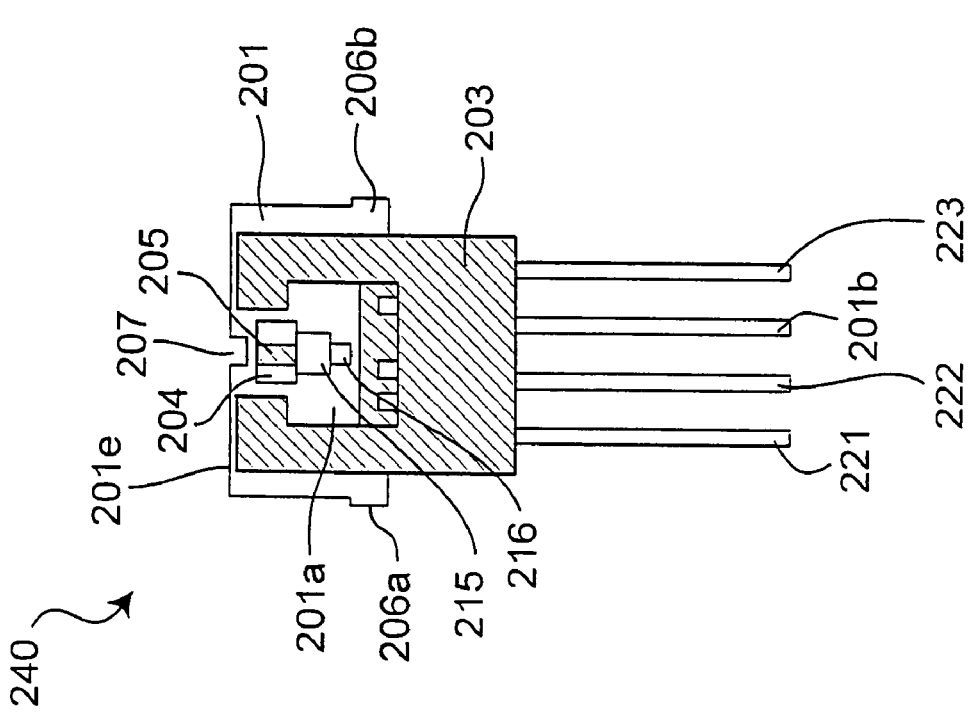

OPTICAL PICKUP DEVICE, SEMICONDUCTOR LASER DEVICE AND HOUSING USABLE FOR THE OPTICAL PICKUP DEVICE, AND METHOD OF MANUFACTURING SEMICONDUCTOR LASER DEVICE

This application is a divisional application of U.S. Ser. No. 11/090,182, filed Mar. 28, 2005 which is a nonprovisional application claiming priority under 35 U.S.C. § 119(a) on Patent Application Nos. 2004-098613, 2004-127635, 2004-186259, 2004-193503, 2004-192960, and 2005-012554, filed in Japan on 30 Mar. 2004, 23 Apr. 2004, 24 Jun. 2004, 30 Jun. 2004, 30 Jun. 2004, and 20 Jan. 2005, respectively, the entire contents of which are hereby incorporated by reference.

BACKGROUND OF THE INVENTION

The present invention relates to an optical pickup device for reading information recorded on an optical recording medium and/or writing a signal on an optical recording medium, a semiconductor laser device and a housing usable for the optical pickup device and a method of manufacturing such a semiconductor laser device.

Semiconductor laser devices are widely used as components of optical pickup devices in order to read the information recorded on information recording media such as CD-ROM (Compact Disc Read-Only Memory), MD (Mini Disc) and so on. The semiconductor laser devices include a frame type semiconductor laser device as disclosed in JP 2002-43679 A. The frame type semiconductor laser device has a package in which a metal lead frame and a plurality of leads that serve as electrodes are integrated with a resin (outer casing). A semiconductor laser chip ("laser chip") is mounted in an element-placing portion (a portion on which a chip is to be mounted) of the lead frame, and the laser chip and the electrode leads are electrically connected to each other via wires. JP 2002-43679 A is intended to improve the heat dissipation efficiency by providing the lead frame with wing portions projecting from side surfaces of the resin.

However, recent optical pickup devices often employ high-power laser chips, and it is necessary to further improve the heat dissipation characteristics of the laser chips.

JP 2002-43679 A also discloses an example in which the laser chip is mounted in the element-mounting portion via a submount. In this example, the submount is constructed of a Si substrate with a built-in monitoring photodetector, and the laser chip is mounted on the substrate with solder or the like. In operation, the laser chip emits laser light forward and also backward. The laser light emitted backward is partially incident on the monitoring photodetector, and the laser light to be emitted forward from the laser chip is controlled on the basis of the output of the monitoring photodetector.

However, in this example, the greater part of the laser light emitted backward from the laser chip is not incident on the monitoring photodetector due to restrictions on the arrangement of the laser chip and the submount. Therefore, the quantity of light incident on the monitoring photodetector may be so little that it may cause inconvenience in controlling the laser light to be emitted forward from the laser chip.

In a frame type semiconductor laser device described in JP 2003-31885 A, an outer casing, which surrounds the peripheries of a laser chip and a monitoring photodetector, is provided, and a light-reflecting surface is provided on a part of the inner surface of the outer casing. The laser light emitted backward from the laser chip is reflected on the light-reflecting surface, and the greater part of the light is incident on the monitoring photodetector.

However, in the example of JP 2003-31885 A, if a stress is applied to the outer casing while the semiconductor laser device is being mounted on an electronic device such as an optical pickup device, the light-reflecting surface may be distorted. As a result, disadvantageously, the quantity of light incident on the monitoring photodetector may not be stabilized.

JP 2003-31885 A also discloses that the outer casing is constructed of two parts of a lower part and an upper part, and the upper outer casing is attached as a cover (cap) for protecting the laser chip to the lower outer casing by press fitting or the like.

When attaching the upper outer casing to the lower outer casing by press fitting, the upper outer casing is brought in pressure contact with the lower outer casing by being urged in a direction roughly perpendicular to the optical axis of the laser chip. Therefore, when transmitted to the lead frame, the stress applied to the lower outer casing is transmitted in the direction roughly perpendicular to the optical axis of the laser chip. A window portion is formed at the lower outer casing so as not to interrupt the laser light from the laser chip.

As is apparent from above, since the stress is applied to a portion including the window portion (which portion is of a small strength) of the lower outer casing, it is possible that the stress cannot be sufficiently absorbed by the lower outer casing and transmitted to the lead frame, disadvantageously causing the warp or bending of the lead frame.

SUMMARY OF THE INVENTION

A first object of the present invention is, therefore, to provide a semiconductor laser device and an optical pickup device excellent in heat dissipation property and productivity.

A second object of the present invention is to provide a semiconductor laser device capable of stably receiving a large quantity of laser light emitted backward from the laser chip on the monitoring photodetector and a manufacturing method therefor.

A third object of the present invention is to provide a semiconductor laser device of which the lead frame is prevented from being warped and bent during the press fitting of a cap.

A fourth object of the present invention is to provide a semiconductor laser device capable of preventing an adverse effect from being exerted on the write characteristic of optical disk apparatuses and a signal control system of the pickup.

A fifth object of the present invention is to provide a semiconductor laser device capable of adjusting the optical axis of the light emitted from the laser chip that is mounted on a thin metal plate directly or via a submount, and a housing for mounting such a semiconductor laser device. A further object is to provide a semiconductor laser device in which the light-emitting point can be prevented from shifting even if the optical axis is adjusted, and a housing for mounting such a laser device.

A semiconductor laser device according to a first aspect of the present invention includes:

a first lead having a plate-like mounting portion on which a semiconductor laser chip is mounted and a lead portion extending from the mounting portion;

a second lead extending along the lead portion of the first lead; and a retention portion made of an insulative material that integrally retains the first lead and the second lead, wherein the mounting portion of the first lead has a back surface exposed from the retention portion, and the first lead further has a tie bar portion projecting from the mounting portion along the back surface of the mounting portion.

The "back surface of the mounting portion" of the first lead means a surface opposite from a surface on which the laser chip is mounted.

If the mounting portion (back surface) of the first lead and the tie bar portion are brought in contact with a housing of, for example, an optical pickup device in the stage in which the semiconductor laser device is mounted on the optical pickup device, the tie bar portion functions together with the mounting portion for heat dissipation or release during the operation of the laser chip. That is, the heat generated by the laser chip is discharged to the housing through the mounting portion and the tie bar portion. Therefore, the heat discharge area is broadened, and the heat dissipation property is improved.

In one embodiment, the tie bar portion projects in a direction perpendicular to an optical axis of the semiconductor laser chip. Therefore, the laser light emitted from the laser chip is not blocked by the tie bar portion.

In one embodiment, the tie bar portion has an end in a projecting direction thereof, the end being located farther away from the semiconductor laser chip than any portion of the mounting portion. Therefore, the heat discharge area is broadened, and the heat dissipation property is improved.

In one embodiment, the tie bar portion has a width equal to or greater than a width of the semiconductor laser chip.

The "width" of the tie bar portion here means a width in the direction perpendicular to the projecting direction in which the tie bar portion projects in a plane along the back surface of the mounting portion. Moreover, the "width" of the laser chip means the width in the direction perpendicular to the optical axis of the laser light emitted from the chip.

In this embodiment, the heat discharge area is broadened, and a satisfactory heat dissipation property is obtained.

In one embodiment, the second lead has an anti-fall portion for restraining movement of the second lead relative to the retention portion. Therefore, if the second lead is, for example, soldered in an assembling stage in which the semiconductor laser device is mounted on an optical pickup device, and if the material of the retention portion is softened by the heat of solder, the second lead is prevented from moving with respect to the retention portion by virtue of the anti-fall portion. Therefore, soldering is stably achieved. Thus, excellence in productivity is assured.

In one embodiment, the first lead has a recess portion at a front edge of the mounting portion, the recess portion receding so as to indicate a position in which the semiconductor laser chip is mounted, and an inner edge of the recess portion corresponding to a portion just ahead of the semiconductor laser chip is inclined with respect to an optical axis of the semiconductor laser chip.

Note that with regard to the "front edge" of the mounting portion, the "front" is herein defined as the direction in which the laser chip emits laser light to the outside.

In the embodiment, the first lead has the recess portion receding so as to indicate the mounting position of the laser chip at the front edge of the mounting portion. Therefore, it becomes easy to perform the positioning or alignment of the laser chip when the laser chip is mounted on the mounting portion in the manufacturing stage. For example, when the laser chip is mounted on the mounting portion via a rectangular plate-like submount member, it is proper to adjust the position of a front edge of the submount member along an edge of the recess portion. Moreover, the inner edge of the recess portion corresponding to a position just in front of the laser chip is inclined with respect to the optical axis of the laser chip. Therefore, even if return light from an illumination object to which the laser light is applied (e.g., an information recording medium) is incident on the recess portion and the submount member during the operation of the laser chip, the return light is reflected by the inner edge of the recess portion and the front edge of the submount member in a direction different from the direction in which the laser chip emits laser light. As a result, in the device (e.g., an optical pickup device) that employs the semiconductor laser device, the return light from the illumination object can be prevented from causing noises.

If the thickness of the first lead is partially varied, the height of each portion of the first lead can be set considering convenience of wire bonding. This contributes to good productivity.

In one embodiment, the mounting portion of the first lead has a thickness that is smaller in a part on which the semiconductor laser chip is positioned than in remainder of the mounting portion.

According to the embodiment, the level difference between an upper, or top surface of the laser chip and an upper surface of the remainder of the mounting portion is reduced. Therefore, this facilitates connection of the upper surface of the laser chip with the upper surface of the mounting portion with a wire by wire bonding technique. Therefore, good productivity is offered.

In one embodiment, a thickness of the lead portion of the first lead is greater than a thickness of the mounting portion so that a difference in level between an upper surface of the semiconductor laser chip and an upper surface of the lead portion of the first lead is reduced.

According to the embodiment, the level difference between the upper surface of the laser chip and the upper surface of the remainder of the mounting portion is reduced. Therefore, this facilitates connection of the upper surface of the laser chip with the upper surface of the mounting portion with a wire by wire bonding technique. Therefore, good productivity is offered.

In one embodiment, the mounting portion and the lead portion of the first lead are welded together.

In this embodiment, the first lead is fabricated without subjecting to a bending process, thus fabricated easily. Therefore, the semiconductor laser device is excellent in productivity.

In one embodiment, the mounting portion of the first lead has a through hole in a region other than a mounting region in which the semiconductor laser chip is located, said through hole connecting a top surface and a back surface of the mounting portion. The back surface of the mounting portion has a recess, which is continuous from the through hole and surrounds a periphery of the through hole. And, the recess is filled with a material of the retention portion supplied from a top surface side of the mounting portion through the through hole.

In the semiconductor laser devices of this embodiment, the mounting portion is held in the retention portion. This prevents the mounting portion and the retention portion from being separated from each other.

If the space on the back side of the recess or the cut-and-raised portion is properly filled with the material of the retention portion, the back surface side of the mounting portion comes to have a flat structure. With the arrangement, the mounting portion (back surface) of the first lead and the tie bar portion can be closely attached to the housing of, for example, an optical pickup device in the stage in which the semiconductor laser device is mounted on the optical pickup device. Therefore, heat dissipation characteristic is not impaired.

In one embodiment, each of the lead portion of the first lead and the second lead has a local thin neck at an outer lead portion projecting from the retention portion.

In the embodiment, the lead portion of the first lead and the second lead are easily cut at their respective necks to detach their outer lead portions projecting from the retention portion. If each outer lead portion is cut at the neck, the lead will have a cut end surface which is smaller than when the lead is cut in a place other than the neck. Therefore, if each outer lead portion is provided by plating a core material with a metal of good solder wettability, a ratio of a surface of good solder wettability (plated surface) to an exposed surface (end surface) of the core material is increased. Therefore, in soldering the leads in the stage of mounting the semiconductor laser device on, for example, an optical pickup device, the semiconductor laser device displays improved solder wettability as a whole so that the productivity is improved.

In one embodiment, each of the leads has a core material plated with a metal having good solder wettability to the core material.

In the embodiment, if each lead is cut at the neck, a ratio of a surface of good solder wettability (plated surface) to an exposed surface (end surface) of the core material is increased. Therefore, in soldering the leads in the stage of mounting the semiconductor laser device on, for example, an optical pickup device, the semiconductor laser device displays improved solder wettability as a whole so that the productivity is improved.

The core material may be Cu, and an outermost surface of the plating metal may be made of Sn or Au.

The retention portion may be made of a resin. In this case, the retention portion is easily formed by the resin molding technique using a metal mold.

The retention portion may be made of ceramics. In this case, the heat dissipation property is improved.

In one embodiment, the retention portion has a black color. Therefore, even if return light from an illumination object, to which the laser light is applied (e.g., an information recording medium), is incident on the retention portion during the operation of the laser chip, the return light is not reflected but absorbed by the retention portion. As a result, the return light from the object is prevented from causing noises in an apparatus (e.g., optical pickup device) that employs the semiconductor laser device.

The semiconductor laser device may have a cover for protecting the semiconductor laser chip, which is provided on the retention portion.

An optical pickup device according to a second aspect of the present invention has a housing, and the semiconductor laser device according to the first aspect of the present invention. And, the semiconductor laser device is mounted to the housing with both the mounting portion of the first lead and the tie bar portion being in contact with the housing.

In the optical pickup device of the present invention, the tie bar portion works for heat dissipation together with the mounting portion during the operation of the laser chip. That is, the heat generated by the laser chip is discharged to the housing through the mounting portion and the tie bar portion. Therefore, the heat discharge area is broadened, and the heat dissipation property is improved.

An optical pickup device according to a third aspect of the present invention includes:

a semiconductor laser device having a metallic heat sink and a semiconductor laser chip fixed to a top surface of the heat sink; and a housing to support the semiconductor laser device;

the housing having a metallic contact surface put in surface contact with a greater part of a back surface of the heat sink.

In the present specification, the "greater part" of the back surface means 50% or more of the area of the back surface.

According to the optical pickup device of the construction, the greater part of the back surface of the heat sink is put in surface contact with the housing, by which the heat escapes away from the greater part of the heat sink to the housing. Therefore, the quantity of heat dissipation by the heat sink is great, and the heat in the neighborhood of the laser chip also escapes to the housing. Therefore, the heat dissipation property of the semiconductor laser device can be improved. Moreover, since the heat dissipation performance of the semiconductor laser device is high, it is possible to not only prolong the operating life of the semiconductor laser device but also to operate the semiconductor laser device in a high-temperature environment. Therefore, the optical pickup device is excellent in quality and reliability.

The back surface of the heat sink may be fixed to the contact surface of the housing with a metallic brazing material (e.g., solder).

In one embodiment, the housing has side surfaces which are curved surfaces (e.g., cylindrical surfaces).

In this case, if the housing with the semiconductor laser device is inserted in, for example, a cylindrical hole, the semiconductor laser device together with the housing is allowed to be rotated while being supported by the hole. Therefore, the position of the laser light emitted the laser chip can easily be adjusted.

The heat sink may be provided with a recess portion or a through hole.

When the back surface of the heat sink is fixed to the contact surface of the housing with solder, it becomes easy for solder to flow around by virtue of the recess portion or the through hole. Therefore, the solder can be uniformly spread between the back surface of the heat sink and the contact surface. That is, the wettability of the solder can be improved, and the adhesion of the back surface of the heat sink to the contact surface of the housing is improved.

In one embodiment, the semiconductor laser device has a resin provided only on a top surface side of the heat sink.

When the back surface of the heat sink is soldered to the contact surface of the housing, the soldering is not obstructed by the resin.

The back surface of the heat sink and/or the contact surface of the housing may have been subjected to a surface treatment (e.g., metal plating) to improve wettability of the metallic brazing material.

An optical pickup device according to a fourth aspect of the present invention includes:

a semiconductor laser device having a metallic heat sink and a semiconductor laser chip fixed to a top surface of the heat sink;

a housing to support the semiconductor laser device; and a substrate disposed between the back surface of the heat sink and the housing, the substrate having a top surface put in surface contact with a greater part of a back surface of the heat sink, and the housing having a metallic contact surface put in surface contact with a greater part of a back surface of the substrate.

According to the optical pickup device of the construction, the greater part of the back surface of the heat sink is brought in surface contact with the surface of the substrate, and the greater part of the back surface of the substrate is brought in surface contact with the contact surface of the housing, by which the heat escapes from the greater part of the heat sink to the housing via the substrate. Therefore, the amount of heat dissipation by the heat sink is large, and the heat in the neighborhood of the laser chip also escapes to the housing via the substrate. Therefore, the heat dissipation performance of the semiconductor laser device is improved.

Moreover, the substrate is arranged between the back surface of the heat sink and the contact surface of the housing, and therefore, other devices can be mounted on the substrate.

A semiconductor laser device according to a fifth aspect of the present invention includes:

a first lead including a plate-like mounting portion;

a second lead which is separate from the first lead;

a retention portion made of an insulative material that integrally retains the first lead and the second lead;

a semiconductor laser chip that is mounted in a front part of the mounting portion and emits laser light forward and backward;

a monitoring photodetector provided at the mounting portion such that the monitoring photodetector is disposed behind the semiconductor laser chip; and a light reflector which is separate from the retention portion and disposed behind the monitoring photodetector on the mounting portion, wherein the light reflector, upon receipt of at least part of laser light emitted backward from the semiconductor laser chip, reflects the light toward the monitoring photodetector.

Note that the laser light emitted from the laser chip is used for the original purpose of the semiconductor laser device. For example, when the semiconductor laser device of the present invention is mounted on an optical pickup device, the device is used to irradiate an optical disk.

In the semiconductor laser device of the present invention, the light reflector receives at least part of the laser light emitted backward from the laser chip and reflects the light toward the monitoring photodetector. Therefore, the quantity of light incident on the monitoring photodetector becomes greater than when no light reflector is provided. Moreover, the light reflector is separated from the retention portion, and therefore, the light reflector is not distorted even if a stress is applied to the retention portion while the semiconductor laser device is being mounted on an electronic device such as an optical pickup device. Therefore, the quantity of light incident on the monitoring photodetector is stabilized. As a result, the laser light emitted forward from the laser chip is satisfactorily controlled on the basis of the output of the monitoring photodetector.

It is desirable that the first lead is made of a metal, and a bottom surface of the mounting portion is exposed from the lead fixation resin. In this case, heat generated by the laser chip in operation is efficiently discharged through the bottom surface of the mounting portion.

The light reflector can be formed of, for example, a white resin, a resin plated with a metal, a metal or the like. When the white resin is used, the light reflector can easily be processed into a shape appropriate for reflection.

The light reflector may have a reflection surface inclined with respect to a laser light emitting direction of the semiconductor laser chip so as to reflect the laser light from the semiconductor laser chip toward the monitoring photodetector.

In one embodiment, the semiconductor laser chip is mounted on the mounting portion via a plate-like submount, and the monitoring photodetector is housed in a portion, of the submount, which is located behind the semiconductor laser chip.

With this arrangement, parts count is reduced than when the submount and the monitoring photodetector are provided separately from each other.

In one embodiment, in fabricating the semiconductor laser device of the fifth aspect, at least the monitoring photodetector and the light reflector are concurrently bonded onto the mounting portion. The semiconductor laser device is simply fabricated.

A semiconductor laser device according to a sixth aspect of the present invention includes:

a first lead having a plate-like mounting portion on which a semiconductor laser chip is mounted and a lead portion extending from the mounting portion;

a second lead extending along the lead portion of the first lead; and a retention portion made of an insulative material that integrally retains the first lead and the second lead, wherein the retention portion includes a frame member disposed on a semiconductor laser chip side of the first lead, and the frame member has a window portion for emitting laser light from the semiconductor laser chip;

a cap to be fit in the frame member of the retention portion; and a pressure contact structure that urges the frame member of the retention portion against the cap, and vice versa, in a direction roughly parallel to an optical axis of the semiconductor laser chip so as to bring the frame member and the cap in pressure contact with each other when the cap is fit in the frame member of the retention portion.

According to the semiconductor laser device of the present invention, the cap can be attached to the inside of the retention portion by press fitting. At this time, a stress applied to the frame member of the retention portion is transmitted in the direction roughly parallel to the optical axis of the laser chip when transmitted to the mounting portion of the first lead. That is, the stress is absorbed by portions (portions of great strength) except for the window portion of the frame member of the retention portion, and therefore, the stress is restrained from being transmitted to the mounting portion of the first lead. Therefore, even if the cap is press fit to the frame member of the retention portion, the first lead (lead frame) is prevented from warping or bending.

In one embodiment, the cap has a projection engaged with the window portion of the frame member of the retention portion.

According to the semiconductor laser device, engaging the projection of the cap with the window portion of the frame member of the retention portion allows the laser chip to be reliably protected.

In one embodiment, the cap has one or more projections that project in a direction roughly parallel to the optical axis of the semiconductor laser chip, the frame member of the retention portion has one or more recess portions receding in the direction roughly parallel to the optical axis of the semiconductor laser chip, and the pressure contact structure has the one or more projections and said one or more recess portions, and the or each projection is engaged with a corresponding recess portion while being brought in pressure contact therewith when the cap is attached to the frame member of the retention portion.

According to the embodiment, even with a simple structure, the cap can reliably be aligned with the frame member of the retention portion while being press fit in the retention portion.

In one embodiment, the or each projection has a hemispherical shape, and the or each recess portion has a shape complementary to the projection. Due to the shapes of the projection(s) and the recess(es), the stress can be evenly transmitted in a wide area so that an intense stress locally applied is avoided.

In one embodiment, the cap has two opposite outer surfaces which extend in a direction roughly perpendicular to the optical axis of the semiconductor laser chip. Also, the frame member of the retention portion has two opposite inner surfaces which extend in the direction roughly perpendicular to the optical axis of the semiconductor laser chip. The projections are provided at the two outer surfaces of the cap, two to outer surface, and the recess portions are provided at the two inner surfaces of the frame member of the retention portion, two to inner surface.

According to the embodiment, stress generated in pressing the cap into the frame member of the retention portion is evenly transmitted.

The cap may have a handling lug. In the case, the cap can easily be handled with tweezers or the like.

In one embodiment, the first lead has tie bar portions that project in opposite directions roughly perpendicular to the optical axis of the semiconductor laser chip from respective opposite end edges of the mounting portion that are situated in the directions roughly perpendicular to the optical axis of the semiconductor laser chip. Also, the lug of the cap is formed so as to be oriented in a direction roughly parallel to the optical axis of the semiconductor laser chip when the cap is fit in the frame member of the retention portion.

According to the present embodiment, the lug of the cap is formed so as to be oriented in a direction roughly perpendicular to the tie bar portions. Therefore, in manufacturing the semiconductor laser devices, at the step of pressing the cap into the frame member of the retention portion, the lug is directed roughly perpendicular to tie bars through which a plurality of mounting portions are connected together into a linear state. Therefore, workability can be improved when the press fitting of the cap is carried out in the state in which the plurality of mounting portions are connected together by the tie bars. In concrete, when the cap is manually handled and placed from the direction perpendicular to the tie bars with tweezers or the like during conveyance of the semiconductor laser device in the direction parallel to the tie bars, the lug is directed in the direction roughly perpendicular to the operator, so that the operator can press the cap in place with his or her arms fit to the sides of his or her body, which allows easy working and requires a reduced working space.

The lug may be defined between two lug-forming recess portions that are opposed to each other at an interval on one surface of the cap.

In this case, since the lug of the cap is formed without raising the upper surface of the cap, the thickness of the cap is prevented from being increased. Thus, the thickness of the semiconductor laser device is prevented from being increased.

If the lug-forming recess portions each have a crescentic shape, it becomes easy to insert the tips of tweezers into the lug-forming recess portions when the lug is handled, and good workability is obtained.

The retention portion and the cap may be made of an identical material. Then, the material cost can be reduced.

If the retention portion and the cap is made of a resin, the retention portion and the cap can easily be formed by resin molding technique using metal molds.

In one embodiment, the retention portion and the cap have a black color.

According to the present embodiment, even if return light from an illumination object to which the laser light is applied (e.g., an information recording medium such as a disk) is incident on the retention portion and the cap during the operation of the laser chip, the return light is not reflected but absorbed by the black retention portion and the cap. As a result, noises caused by the return light from the illumination object are prevented from being generated in an apparatus (e.g., an optical pickup device) that employs the semiconductor laser device.

A semiconductor laser device according to a seventh embodiment of the present invention includes a metal support having a mounting surface and a front surface adjoining the mounting surface, and a semiconductor laser chip mounted on the mounting surface, and which emits laser light from a light-emitting end surface located on the front surface side of the semiconductor laser chip. And, at least part of the front surface is inclined with respect to the light-emitting end surface and parallel to a plane obtained by rotating the light-emitting end surface around a perpendicular line to the mounting surface.

When the thus constructed semiconductor laser device is employed as a light source of an optical disk apparatus, even if a sub-beam returning from a loaded optical disk impinges upon the front surface of the metal support, the sub-beam is prevented from going back to the optical disk because at least part of the front surface of the metal support is inclined with respect to the light-emitting end surface of the laser chip. Therefore, the semiconductor laser device can be prevented from exerting an adverse effect on the write characteristic of the optical disk apparatus and the signal control system of a pickup.

Moreover, the at least part of the front surface of the metal support is parallel to the plane obtained by rotating the light-emitting end surface of the laser chip around the perpendicular line, or normal, to the mounting surface of the metal support. Therefore, the at least part of the front surface of the metal support can be used as a reference surface for positioning the laser chip. That is, using the at least part of the front surface of the metal support as a reference surface facilitates alignment of the laser chip.

There may be provided a submount made of a dielectric substance or a semiconductor between the semiconductor laser chip and the metal support. In this case, efficiency of discharging heat of the laser chip can be improved.

In one embodiment, an end surface located on the front surface side of the submount is inclined with respect to the light-emitting end surface and parallel to a plane obtained by rotating the light-emitting end surface around the perpendicular line to the mounting surface.

According to the semiconductor laser device of the embodiment, even if a sub-beam returning from the optical disk impinges on the end surface of the submount, the sub-beam can be prevented from being returned to the optical disk. Therefore, even if the submount is located between the laser chip and the metal support, the semiconductor laser device can be prevented from exerting an adverse effect on the write characteristic of the optical disk apparatus and the signal control system of the pickup.

Moreover, the end surface of the submount can be used as the reference surface for positioning the laser chip. Therefore, even if the submount is located between the laser chip and the metal support, the laser chip can easily be aligned by using the end surface of the submount.

The metal support may be a frame made of a metal thin plate. In this case, the manufacturing cost can be reduced.

Also, an end surface located on the front surface side of the submount may be roughly parallel to the at least part of the front surface. In this case, the at least part of the front surface of the metal support can be used as a reference surface for positioning the submount. Therefore, using the at least part of the front surface of the metal support will facilitate placement of the submount in a prescribed position.

A semiconductor laser device according to an eighth embodiment includes:

a main body;

a semiconductor laser chip fixed to the main body; and a first rotation guide mechanism that is provided at the main body and allows the main body to be rotatably supported so that a laser light emitting direction of the semiconductor laser chip is adjustable.

In the semiconductor laser device of the construction, provision of the first rotation guide mechanism at the main body allows the main body to be rotated while being supported, so that the laser light emitting direction of the laser chip is adjusted. Therefore, when the semiconductor laser device is mounted on, for example, a housing, the optical axis of the outgoing beam of the laser chip can be adjusted.

In one embodiment, the first rotation guide mechanism enables the main body to rotate around a neighborhood of a light-emitting point of the semiconductor laser chip.

In one embodiment, the main body is made of a metal plate.

In one embodiment, the first rotation guide mechanism has a curved portion provided at an edge of the main body.

In one embodiment, the first rotation guide mechanism comprises a recess portion provided at the main body (e.g., a cut provided at the edge of the main body).

An inner wall surface of the recess portion may be a conical surface.

In one embodiment, the first rotation guide mechanism has a groove provided at the resin member in such a manner that the groove roughly coincides with a circumference of a circle centered on the semiconductor laser chip.

In one embodiment, the main body has a metal plate and a resin member integrated with the metal plate, and the first rotation guide mechanism comprises a groove provided at the resin member in such a manner that the groove roughly coincides with a circumference of a circle centered on the semiconductor laser chip.

A housing according to a ninth aspect of the present invention includes:

a housing main body; and a second rotation guide mechanism that is provided at the housing main body and rotatably supports a semiconductor laser device so that a laser light emitting direction of the semiconductor laser device is adjustable.

According to the housing of the construction, provision of the second rotation guide mechanism at the housing main body allows the laser light emitting direction of the semiconductor laser device to be adjusted by rotating the semiconductor laser device while supporting the same. Therefore, when mounting the semiconductor laser device on the housing, adjustment of the optical axis of the outgoing beam of the laser chip can be performed.

In one embodiment, the second rotation guide mechanism enables the semiconductor laser device to rotate around a neighborhood of the light-emitting point of the semiconductor laser device.

In one embodiment, the second rotation mechanism includes a guide portion provided at the housing main body and having a curved surface.

In one embodiment, the second rotation mechanism includes at least one projection. The projection may have a conical shape or a circular arc shape.

The semiconductor laser device according to the eighth aspect of the present invention and the housing according to the ninth aspect of the present invention may be combined together and incorporated in an optical pickup device.

In the optical pickup device, the optical axis of the laser chip can be adjusted around the light-emitting point so that the outgoing beam of the laser chip becomes parallel to the optical axis of an optical system of the pickup device.

BRIEF DESCRIPTION OF THE DRAWINGS

The present invention will become more fully understood from the detailed description given hereinbelow and the accompanying drawings which are given by way of illustration only, and thus are not intended to limit the present invention, and wherein:

FIG. 2A is a view of the semiconductor laser device as viewed from above; FIG. 2B is a view of the semiconductor laser device as viewed from the right-hand side; and FIG. 2C is a view of the semiconductor laser device as viewed from below;

FIGS. 3A and 3B are process charts showing manufacturing process steps of the semiconductor laser device;

FIG. 4A is a view showing a portion corresponding to one semiconductor laser device of a frame; FIG. 4B is a sectional view taken along line A-A' in FIG. 4A; FIG. 4C is a sectional view taken along line B-B' in FIG. 4A; FIG. 4D is a view corresponding to FIG. 4C of a modification example in which a recess is provided on the back surface of a mounting portion; and FIG. 4E is a view corresponding to FIG. 4A of a modification example in which an odd-shaped frame is employed;

FIG. 9 is a view showing a shape of the outer lead portion after being cut at the neck portion;

FIGS. 14A, 14B and 14C are a front view, a side view and a bottom view, respectively, of a semiconductor laser device of the present invention;

DETAILED DESCRIPTION OF THE PREFERRED EMBODIMENTS

Embodiments of the present invention will be described in detail below with reference to the drawings.

First Embodiment

Figure 1:
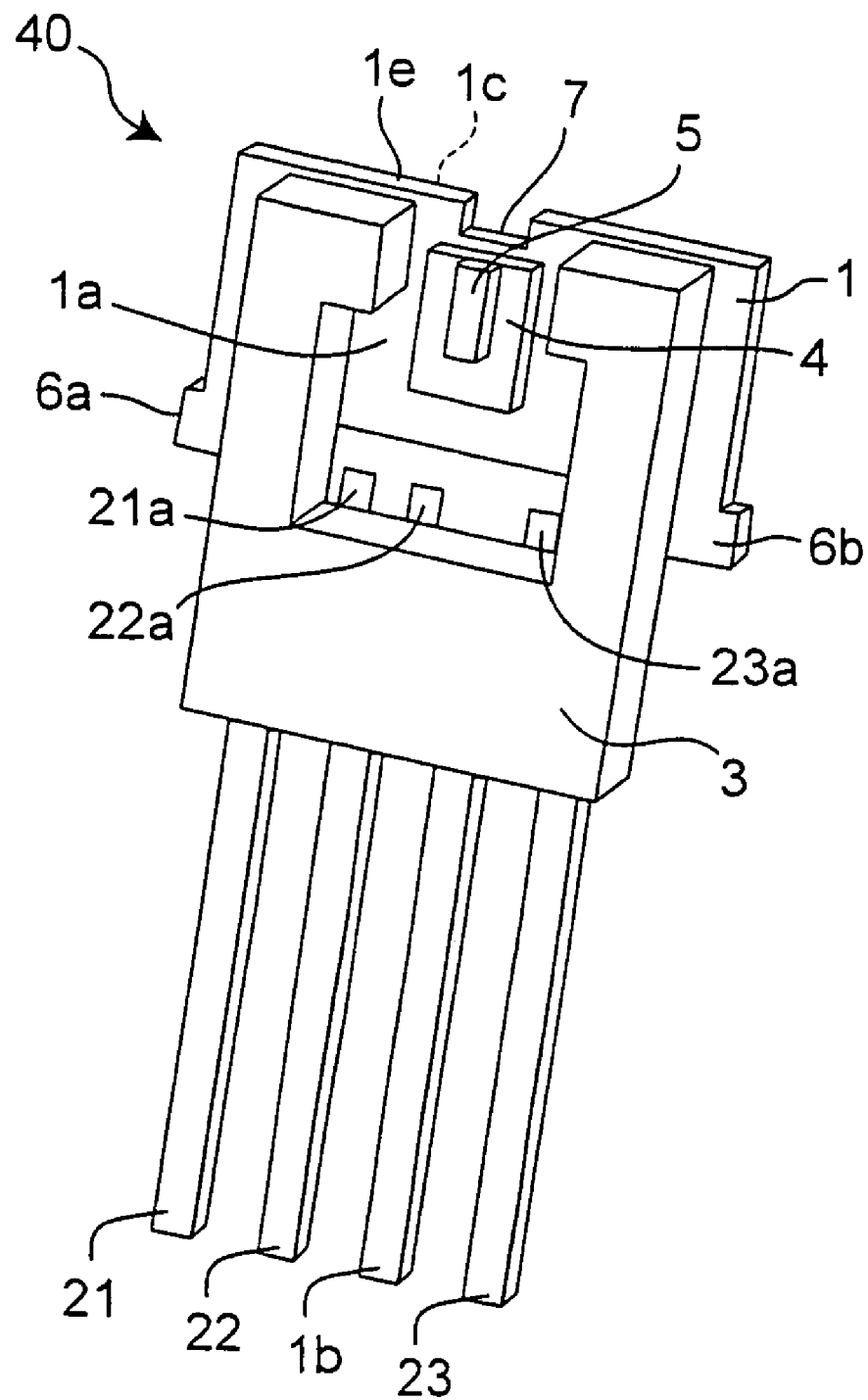
FIG. 1 is a perspective view showing a semiconductor laser device of a first embodiment of the present invention.

FIG. 1 shows a perspective view of a frame type semiconductor laser device 40 of one embodiment of the present invention. FIG. 2A shows the semiconductor laser device 40 as viewed from above. FIG. 2B shows the device of FIG. 2A as viewed from the right-hand side. FIG. 2C shows the device of FIG. 2A as viewed from below. It is noted that the vertical and transverse directions of the semiconductor laser device 40 of the embodiment are specified just for the sake of convenience of explanation.

As shown in FIGS. 1 and 2A, the frame type semiconductor laser device 40 includes a first lead 1 that has a mounting portion 1a on which a laser chip 5 is to be mounted, a plurality of second leads 21, 22 and 23 for signal input and output, and a resin portion 3 that serves as a retention portion for integrally retaining the first lead and the second leads 21, 22 and 23.

In concrete, the first lead 1 has a roughly rectangular plate-like mounting portion 1a, an elongated lead portion 1b extending from the mounting portion 1a, and tie bar portions 6a and 6b projecting from the mounting portion 1a along a back surface 1c of the mounting portion 1a. A semiconductor laser chip ("laser chip") 5 is mounted on the mounting portion 1a via a rectangular plate-like submount member 4. The laser chip 5 has a rectangular parallelepiped external shape elongated in the direction of the optical axis and emits laser light forward (upward in FIG. 2A). As shown in FIG. 2C, the back surface 1c of the mounting portion 1a is exposed from the resin portion 3.

The tie bar portions 6a and 6b project in opposite directions perpendicular to the optical axis of the laser chip 5, i.e., in the transverse direction in FIGS. 2A and 2C. The ends of the tie bar portions 6a and 6b in the projecting directions are located farther away from the laser chip 5 than any arbitrary portion of the mounting portion 1a. The tie bar portions 6a and 6b have a width (width in the direction perpendicular to the projecting directions of the tie bar portions) that is not smaller than a width of the laser chip 5 (width in the direction perpendicular to the optical axis of the laser light emitted from the chip).

Moreover, the first lead 1 has a recess portion 7 at the front edge 1e of the mounting portion 1a to indicate the mounting position of the laser chip 5. With this arrangement, it becomes easy to perform positioning of the submount member 4 and the laser chip 5 when placing the submount member 4 and the laser chip 5 on the mounting portion 1a in the manufacturing stage. For example, it is proper to adjust the position of the front edge of the submount member 4 along the edge of the recess portion 7.

The second leads 21, 22 and 23 are elongated along the lead portion 1b of the first lead 1. As shown in FIG. 1, the inner ends 21a, 22a and 23a of the second leads 21, 22 and 23 are exposed inside of the resin portion 3 formed in a frame-like shape. Wires constructed of Au (not shown) are provided from the laser chip 5 and the submount member 4 to the inner ends 21*a*, 22*a* and 23*a* of the second leads 21, 22 and 23.

The resin portion 3 is made of a black insulative resin material of, for example, epoxy resin in this example. Therefore, the resin portion 3 is easily formed by resin molding using a metal mold.

As described above, in the semiconductor laser device 40, the back surface 1*c* of the mounting portion 1*a* of the first lead 1 is exposed from the resin portion 3, and the tie bar portions 6*a* and 6*b* project from the mounting portion 1*a* along the back surface 1*c* of the mounting portion 1*a*. Moreover, the areas of the tie bar portions 6*a* and 6*b* more than a certain extent are secured. Therefore, if (the back surface 1*c* of) the mounting portion 1*a* of the first lead 1 and the tie bar portions 6*a* and 6*b* are put in contact with the housing of, for example, an optical pickup device in a stage in which the semiconductor laser device is mounted on the optical pickup device, the tie bar portions 6*a* and 6*b* work for heat discharge together with the mounting portion 1*a* during the operation of the laser chip 5. That is, heat generated by the laser chip 5 is radiated through the mounting portion 1*a* and the tie bar portions 6*a* and 6*b* to the housing. The heat discharge area is thus broadened, and the heat dissipation property is improved.

FIGS. 3A and 3B schematically show processes for manufacturing the semiconductor laser device 40.

i) First, a plate material made of Cu is punched to obtain a frame 90 that has a pattern as shown in FIG. 3A (punching process). At this time, the punching is carried out from the back surface 1*c* side of the mounting portion. As a result, burrs are generated on the mounting surface 1*a* side by the punching. Therefore, when mounting the semiconductor laser device 40 on a device such as an optical pickup, the back surface 1*c* can be fit close to the mounting surface of the device. Therefore, the heat dissipation property is improved. At the frame 90, a plurality of sets of the first lead 1 and the second leads 21, 22 and 23 are arranged in two lines along bars 91 and 92 extended in the transverse, or lateral direction in FIG. 3A. The bars 91 and 92 are connected together via connection bars 93. The mounting portions 1*a* of adjoining first leads 1 are connected together via tie bars 6.

ii) Next, the punched frame 90 is partially bent (bending process). The bending style will be described later.

iii) Next, as shown in FIG. 3B, the resin portions 3 are provided on the bent frame 90 by resin molding using a metal mold (resin molding process).

iv) Next, the laser chip 5 is mounted on the mounting portion 1*a* of the first lead 1 via the associated submount member 4 (die bonding process).

v) Next, Au wires are placed from the laser chip 5 and the submount member 4 to the inner ends 21*a*, 22*a* and 23*a* of the second leads 21, 22 and 23 (wire bonding process).

It is desirable to provide a cover for protecting the laser chip 5 on the resin portion 3 in this stage.

vi) Next, individual semiconductor laser devices 40 are obtained by cutting the lead portions 1*b* of the first leads 1 and the second leads 21, 22 and 23 in the neighborhood of the bars 91 and 92, and also cutting the tie bars 6 (tie bar cutting process). In this stage, parts (outer lead portions) of the lead portion 1*b* of the first lead 1 and the second leads 21, 22 and 23 are left projected from the resin portion 3 of each individual semiconductor laser device 40. Moreover, parts 6*a* and 6*b* of tie bars 6 are left projected from the resin portion 3 of each individual semiconductor laser device 40.

vii) The outer lead portions projecting from the resin portion 3 out of the lead portion 1*b* of the first lead 1 and the second leads 21, 22 and 23 are provided with metal plating such that the outer lead portions have an outermost surface made of Ag (silver) or Au (gold) (plating process). With this arrangement, improved solder wettability is obtainable in soldering the outer lead portions after completion of the laser device. When the outermost surface is Ag, a brazing material that does not contain Pb of a high melting point can be used in place of brazing materials containing Pb, which is harmful to the environment. The metal at the outermost surface is not limited to this but allowed to be Sn, Ni, Zn or the like capable of improving the solder wettability.

The semiconductor laser device 40 is easily manufactured by the described method.

FIG. 4A shows a portion as viewed from above, corresponding to one semiconductor laser device of the frame 90 after the ii) bending process. FIG. 4B shows a sectional view taken along the line A-A' in FIG. 4A, and FIG. 4C is a sectional view taken along the line B-B' in FIG. 4A.

As clearly illustrated in FIGS. 4A and 4B, an anti-fall portion if bent in the bending process is provided at the lead portion 1*b* of the first lead 1, and similarly, anti-fall portions 21*f*, 22*f* and 23*f* bent in the bending process are provided at the second leads 21, 22 and 23. The anti-fall portions 21*f*, 22*f* and 23*f* of the second leads 21, 22 and 23 are bent at the same angle as that of the lead portion 1*b* of the first lead 1 when viewed in the direction shown in FIG. 4B. Therefore, even if the material of the resin portion 3 is softened by the heat of solder applied to the second leads 21, 22 and 23 in the mounting stage in which the semiconductor laser device is mounted on, for example, an optical pickup device, the second leads 21, 22 and 23 are prevented from moving or shifting with respect to the resin portion 3 by virtue of the anti-fall portions if, 21*f*, 22*f* and 23*f*. Therefore, soldering is stably achieved, assuring excellence in productivity.

In particular, the anti-fall portion if of the first lead 1 and the anti-fall portion 22*f* of the second lead 22 are processed wider than the other portions. The effect of suppressing the movement of the first lead 1 and the second lead 22 with respect to the resin portion 3 is thus improved.

Moreover, as clearly shown in FIGS. 4A and 4C, cut-and-raised portions 37 and 38 are provided in regions other than the region of the mounting portions 1*a* of the first lead 1 on which the laser chip 5 is mounted, or the regions corresponding to both sides of the laser chip 5 in this example so as to form through holes 30 that penetrate the thickness of the mounting portion 1*a*. After the iii) resin molding process, a space on the back side of the cut-and-raised portions is filled with the material of the resin portion 3 applied thereto from the front surface side of the mounting portion 1*a* through the through hole 30 (see FIG. 2C). Therefore, the mounting portion 1*a* (more accurately the cut-and-raised portions 37 and 38) is (are) held in the resin portion 3. This arrangement increases the bonding strength between the mounting portion 1*a* and the resin portion 3, so that the mounting portion 1*a* and the resin portion 3 are prevented from separating from each other.

Moreover, projections 35 and 36 protrude backward (namely, downward in FIG. 4A) from the mounting portion 1*a*. The resin portion 3 covers the projections 35 and 36 after the iii) resin molding process. This arrangement further prevents the mounting portion 1*a* and the resin portion 3 from separating.

If the space on the back surface of the cut-and-raised portions 37 and 38 are filled with the material of the resin portion 3 in proper quantities, the back surface 1*c* side of the mounting portion 1*a* comes to have a flat structure. With the arrangement, the mounting portion 1*a* of the first lead 1 (back surface 1*c*) and the tie bar portions 6*a* and 6*b* can be put in close contact with the housing of, for example, an optical pickup device in a stage in which the semiconductor laser device 40 is mounted on the optical pickup device. Therefore, the heat dissipation characteristic is prevented from being impaired.

The bottom surface, or back surface side of the semiconductor laser device 40 can be similarly formed into a flat structure also by, instead of bending, employing two frames of a frame for forming the laser chip mounting portion 1*a* and a frame for forming the lead 1*b* and joining the laser chip mounting portion 1*a* to the lead 1*b* by welding.

FIG. 4D shows an example in which in place of the cut-and-raised portions 37 and 38, the mounting portion 1*a* is provided with through holes 32 that penetrate the thickness of the mounting portion 1*a* and the back surface 1*c* of the mounting portion 1*a* is provided with recesses 31 that continue from the respective through holes 32 so as to surround the periphery of the respective through holes 32. Also, in this case as well, the recesses 31 are filled with the material of the resin portion 3 that is applied thereto from the front surface side of the mounting portion 1*a* through the through holes 32 after the iii) resin molding process. With this arrangement, the mounting portion 1*a* is is held in the resin portion 3. This arrangement increases the bonding strength between the mounting portion 1*a* and the resin portion 3, so that the mounting portion 1*a* and the resin portion 3 are prevented from separating from each other.

If the recesses 31 are filled with the material of the resin portion 3 in proper quantities, the back surface 1*c* side of the mounting portion 1*a* comes to have a flat structure. With the arrangement, the mounting portion 1*a* of the first lead 1 (back surface 1*c*) and the tie bar portions 6*a* and 6*b* can be put in close contact with the housing of, for example, an optical pickup device in the stage in which the semiconductor laser device 40 is mounted on the optical pickup device. Therefore, the heat dissipation characteristic is prevented from being impaired.

FIG. 4E shows an example in which a variant frame of a partially varied thickness is employed as the frame 90. In this example, in comparison with the thickness of a portion 1*d* of the mounting portion 1*a* of the first lead 1 on which the laser chip 5 is mounted, the remaining portion 1*a*' of the mounting portion 1*a* has a greater thickness. With this arrangement, a height difference between the upper surface of the mounted laser chip 5 and the upper surface of the remaining portion 1*a*' is reduced.

Therefore, it becomes possible to easily connect the upper surface of the laser chip 5 to the upper surface of the remaining portion 1*a*' by wire bonding for, for example, ground (GND) wiring. That is, the trouble of wire jump and so on due to the difference in height can be eliminated. This arrangement, therefore, provides excellent productivity.

Figure 7:
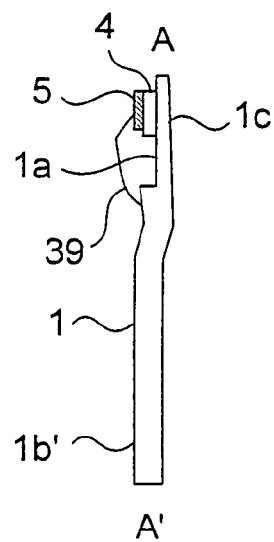
FIG. 7 is a view showing a modification example in which a lead portion is made thicker than a mounting portion in the first lead.
Figure 8:
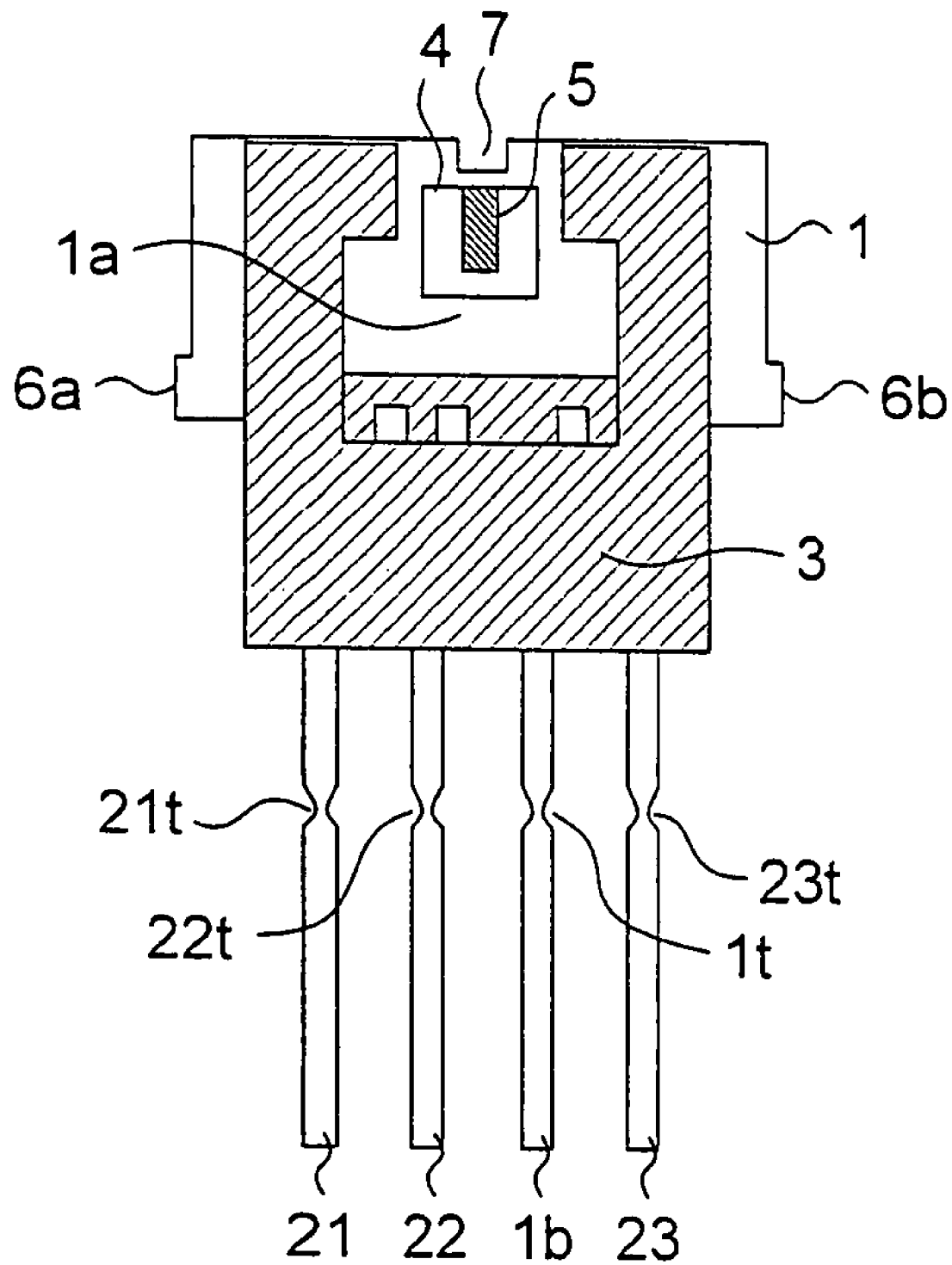
FIG. 8 is a view showing a modification example in which a neck is provided at an outer lead portion.

Moreover, it is acceptable to make the thickness of the lead portion (denoted by 1*b*') of the first lead 1 greater than the thickness of the mounting portion 1*a* as in an example shown in FIG. 7. With this arrangement, a height difference between the upper surface of the laser chip 5 as mounted and the upper surface of the lead portion 1*b*' of the first lead 1 is reduced. Therefore, it becomes possible to easily connect the upper surface of the laser chip 5 to the upper surface of the lead portion 1*b*' of the first lead 1 by wire bonding for, for example, ground (GND) wiring. That is, the trouble of wire flip and so on due to the difference in height can be eliminated. The arrangement, therefore, provides excellent productivity. In this case, it is acceptable to employ two frames of a frame for forming the laser chip mounting portion 1*a* and a frame for forming the lead 1*b*' and join the laser chip mounting portion 1*a* to the lead 1*b*' by welding. By this operation, the first lead 1 is easily produced. The arrangement, therefore, provides excellent in productivity.

Second Embodiment

Figure 5:
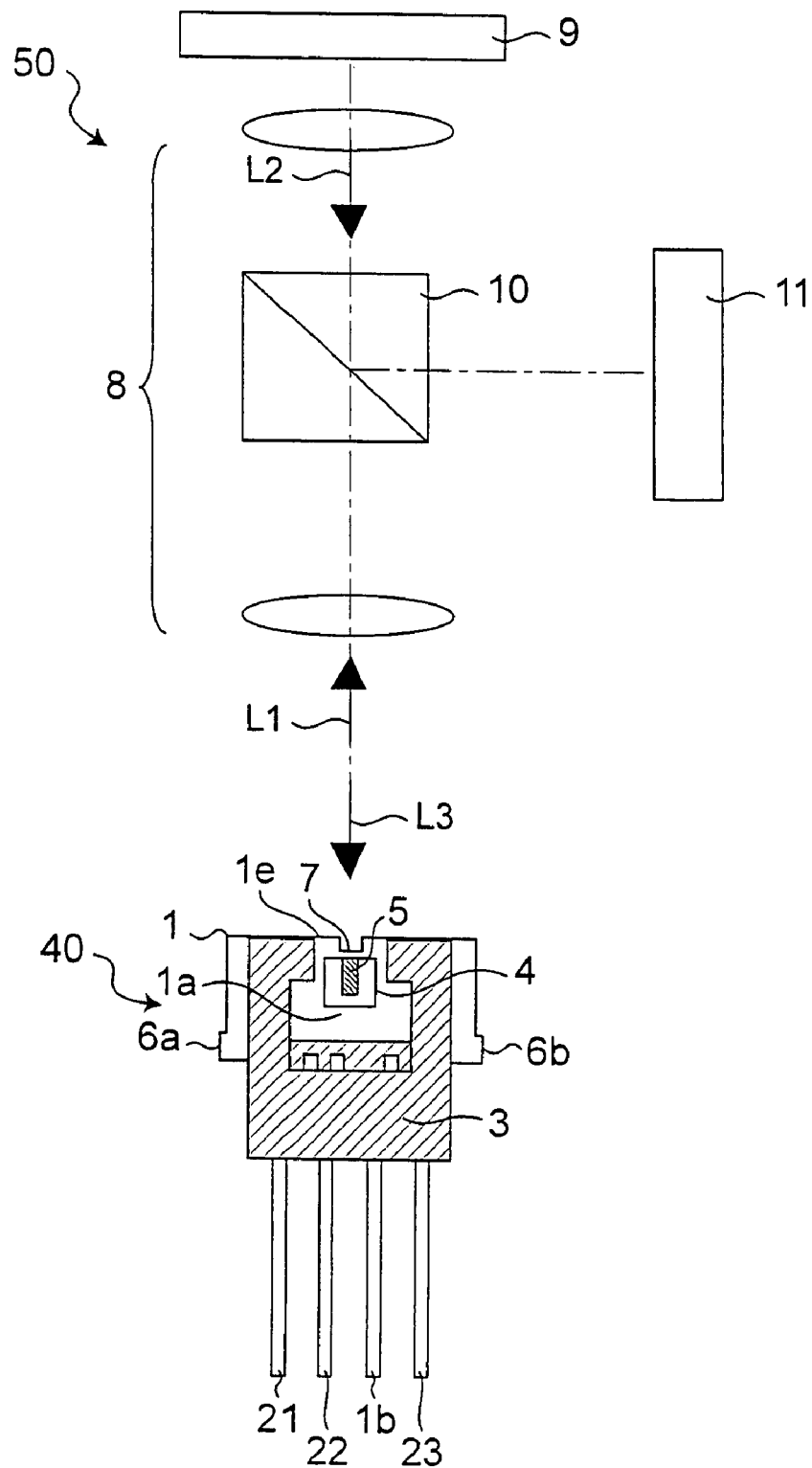
FIG. 5 is a view showing the schematic construction of an optical pickup device of a second embodiment of the present invention.

FIG. 5 schematically shows the construction of an optical pickup device (generally indicated by numeral 50) that employs the semiconductor laser device 40. The optical pickup device 50 has an optical system 8 that includes a beam splitter 10, and a photodetector 11, besides the semiconductor laser device 40. These components are attached to a housing (not shown). Reference numeral 9 denotes an optical disk as an information recording medium which is an object to which the laser light is applied.

A laser light L1 emitted from the laser chip 5 passes through the optical system 8, reaches the disk 9, and is reflected on the disk 9. The reflected laser light L2 returns to the optical system 8, and the laser light L2 is split by the beam splitter 10 and a part of the laser light is made incident on the photodetector 11. Information contained in the disk 9 is read by the photodetector 11. The tie bar portions 6*a* and 6*b* of the semiconductor laser device 40 project in the opposite directions perpendicular to the optical axis of the laser chip 5, and therefore, the laser light L1 emitted from the laser chip 5 is not interrupted by the tie bar portions 6*a* and 6*b*.

On the other hand, part of the reflected laser light L2, which has passed through the beam splitter 10 as it is, becomes a return light L3 and is made incident on the semiconductor laser device 40. As described above, the laser chip 5 is mounted via the submount member 4 on the mounting portion 1*a* on which the laser chip 5 is mounted. Therefore, it is possible that the return light L3 is reflected on the inner edges of the submount member 4 and the recess portion 7 back to the optical system 8, and then to the photodetector 11 via the beam splitter 10, and becomes a noise.

Figure 6:
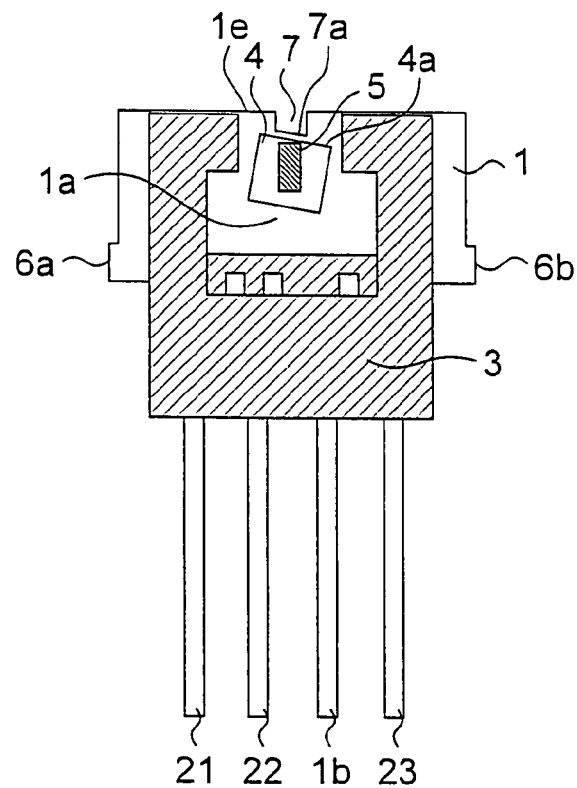
FIG. 6 is a view showing a modification example in which the inner edge of a recess portion of a first lead indicating a laser chip position is inclined.

Accordingly, in the example shown in FIG. 6, the inner edge 7*a* of the recess portion 7 corresponding to a portion just in front of the laser chip 5 at the mounting portion 1*a* is inclined by about five degrees with respect to the optical axis of the laser chip 5, and the front edge 4*a* of the submount member 4 is positioned along the inner edge 7*a* of the recess portion 7. The optical axis of the laser chip 5 is directed straight forward (upward in FIG. 6). With this arrangement, even if the return light L3 from the optical disk 9 is made incident on the submount member 4 and the recess portion 7 during the operation of the laser chip 5, the return light L3 is reflected by the front edge 4*a* of the submount member 4 and the inner edge 7*a* of the recess portion 7 in a direction different from that of the laser light L1 emitted from the laser chip 5. As a result, the return light L3 from the optical disk 9 can be prevented from causing noises in the optical pickup device 50.

Moreover, since the color of the resin portion 3 is black, if the return light L3 from the optical disk 9 is incident on the resin portion 3, the return light L3 is not reflected but absorbed by the resin portion 3. Therefore, the return light L3 from the optical disk 9 can be prevented from causing noises.

In a mounting stage in which the semiconductor laser device 40 is mounted on the optical pickup device 50, the outer lead portions of the lead portion 1*b* of the first lead 1 and the second leads 21, 22 and 23 that project from the resin portion 3 are often cut so as to have lengths appropriate for mounting. When the core material Cu of the leads is exposed at the end surface of each lead, solder wettability is impaired. Accordingly, it is preferable to locally provide narrow necks 1*t*, 21*t*, 22*t* and 23*t* at the outer lead portions as shown in FIG.

8. With this arrangement, the outer lead portions can easily be cut at the necks 1t, 21t, 22t and 23t. Moreover, as clearly illustrated in FIG. 9, the cut end surface 21e becomes smaller in size than when cut at a portion other than the neck. Therefore, the area of the surface of the plating of Sn or Au having good solder wettability becomes broad relative to the area of the exposed surface (end surface) 21e of the core material Cu. Therefore, good solder wettability is obtained when each outer lead portion is soldered in the stage of mounting the semiconductor laser device 40 on the optical pickup device 50, so that good productivity is obtained.

Although the material of the retention portion is an insulative resin in the present embodiment, the material may be ceramic. If the material of the retention portion is ceramic, the heat dissipation property can be further improved.

Third Embodiment

Figure 10A:
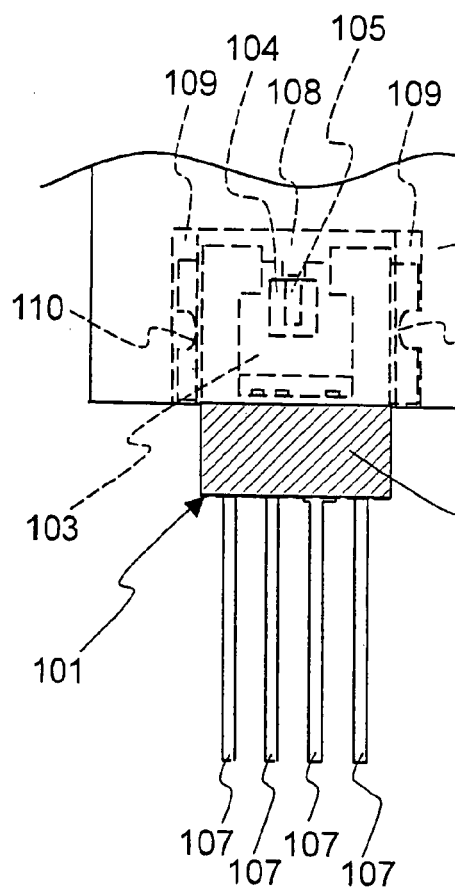
FIG. 10A is a schematic view of a semiconductor laser device and a housing in an optical pickup device of a third embodiment of the present invention as viewed from above.
Figure 10B:
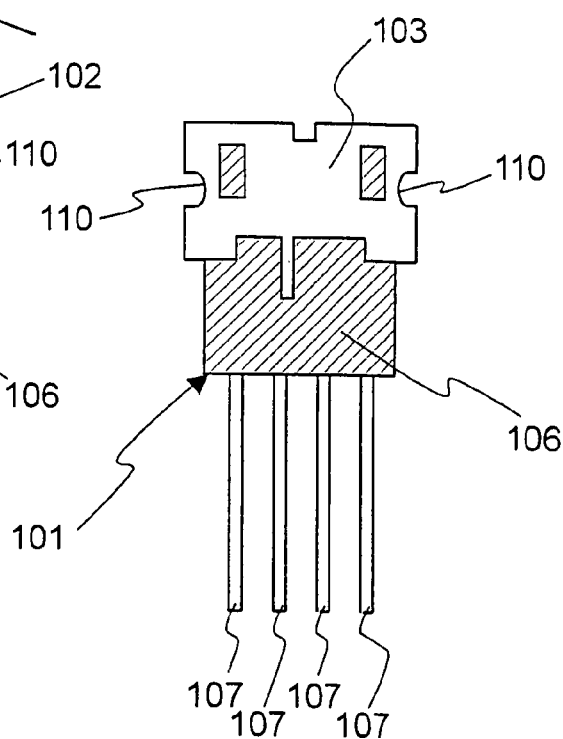
FIG. 10B is a schematic view of the semiconductor laser device as viewed from below.
Figure 10C:
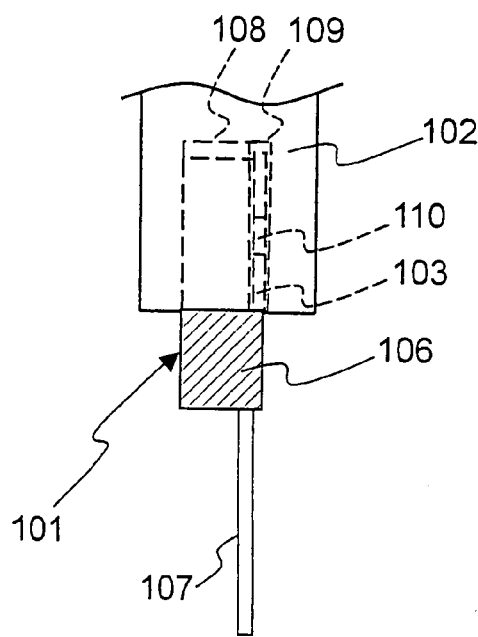
FIG. 10C is a schematic view of the semiconductor laser device and the housing as viewed from a side.
Figure 10D:
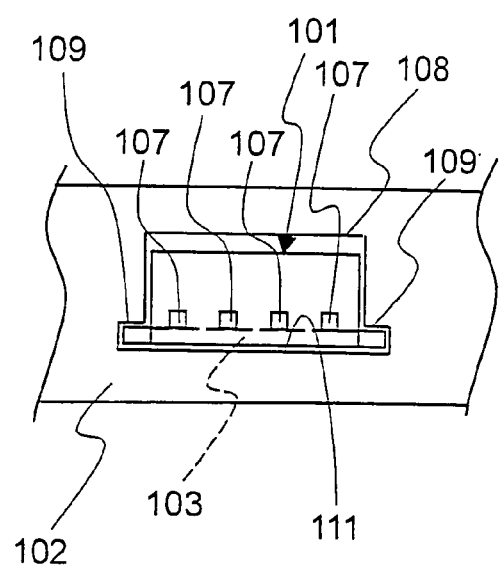
FIG. 10D is a schematic view of the semiconductor laser device and the housing as viewed from behind.

FIG. 10A shows a schematic view of an optical pickup device of a third embodiment of the present invention, as viewed from above, in a state that a semiconductor laser device 101 is fixed to a housing 102. FIG. 10B shows a schematic view of only the semiconductor laser device 101 as viewed from below. FIG. 10C shows a schematic view of the state as viewed from a lateral side. FIG. 10D shows a schematic view of the state as viewed from behind.

As shown in FIG. 10A, the optical pickup device has a frame type semiconductor laser device 101 and a metal housing 102 that supports the semiconductor laser device 101.

The semiconductor laser device 101 has a metal heat sink 103 and a laser chip 105 that is fixed to a front surface of the heat sink 103 via a submount 104 and emits laser light toward an optical disk. As shown in FIG. 10B, a cut 110 is provided as one example of the recess portion at each of opposite side surfaces of the heat sink 103. Moreover, the heat sink 103 is integrated with resin 106 and leads 107. The resin 106 is provided only on the front surface side of the heat sink 103. That is, the resin 106 does not project beyond the back surface of the heat sink 103.

As shown in FIG. 10D, the housing 102 has a metallic contact surface 111 with which the greater part of the back surface of the heat sink 103 is put in contact. Moreover, as shown in FIGS. 10A and 10C, the housing 102 has a hollow portion 108 in which the semiconductor laser device 101 is partially inserted. As shown in FIG. 10D, the hollow portion 108 has, at its wall surfaces, grooves 109 in which side portions of the heat sink 103 are fit. Part of wall surfaces defining the groove 109 and part of the wall surfaces defining the hollow portion 108 constitute a contact surface 111. Although not shown, solder as one example of the metallic brazing material is disposed between the back surface of the heat sink 103 and an opposed wall surface of the hollow portion 108 and between the side surfaces of the heat sink 103 and respective opposed wall surfaces of the groove 109. That is, the heat sink 103 is fixed to the wall surfaces of the hollow portion 108 and of the grooves 109 with solder.

According to the optical pickup device of the construction, heat escapes from the greater part of the heat sink 103 to the housing 102 by virtue of the surface contact of the greater part of the back surface of the heat sink 103 with the contact surface 111 of the housing 102, and therefore, the quantity of heat discharge by the heat sink 103 is great. Moreover, since the back surface of the heat sink 103 in the neighborhood of the laser chip 105 is also put in surface contact with the contact surface 111 of the housing 102, heat in the neighborhood of the laser chip 105 escapes to the housing 102. Thus, the semiconductor laser device 101 has an improved heat dissipation property.

Moreover, since the resin 106 is provided only on the front surface side of the heat sink 103, it is easy to solder the back surface of the heat sink 103 to the contact surface 111 of the housing 102.

Moreover, since the cut portions 110 are provided at the sides of the heat sink 103, solder easily flows around, and the solder uniformly spreads between the back surface of the heat sink 103 and the contact surface 111. That is, the solder wettability is improved.

Although the greater part of the back surface of the heat sink 103 is put in surface contact with the contact surface 111 of the housing 102 in the third embodiment, it is acceptable to put roughly the entirety of the back surface of the heat sink 103 in surface contact with the contact surface 111 of the housing 102.

Moreover, although the cut portions 110 are provided at the side portions of the heat sink 103, it is acceptable to provide a through hole at the heat sink 103. The solder wettability is improved also when the through hole is provided at the heat sink 103.

Moreover, it is acceptable to subject the back surface of the heat sink 103 and/or the contact surface 111 of the housing 102 to a surface treatment for improving the wettability of the metallic brazing material. For example, as one example of the surface treatment, Ag (silver) plating may be applied to the back surface of the heat sink 103 and/or the contact surface 111 of the housing 102.

Fourth Embodiment

Figure 11:
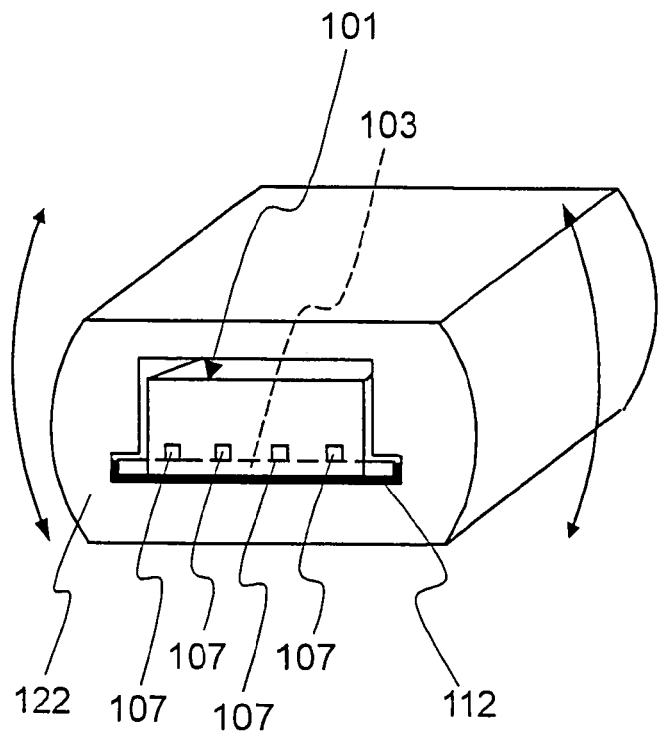
FIG. 11 is a schematic view of a semiconductor laser device and a housing in an optical pickup device of a fourth embodiment of the present invention as viewed obliquely from behind.

FIG. 11 shows a schematic view of an optical pickup device of a fourth embodiment of the present invention, as viewed obliquely from behind, in a state that the semiconductor laser device 101 is fixed to a housing 122. In FIG. 11, the same constituents as those of the third embodiments shown in FIGS. 10A-10D are denoted by the same reference numerals as those of the constituents of FIGS. 10A-10D, and no description is provided therefor. Moreover, in FIG. 11, portions of the leads 107 are not shown, and solder 112, which is not shown in FIGS. 10A-10D, is shown.

The optical pickup device of the present embodiment differs from the third embodiment only in that the device of the present embodiment has a housing 122 whose side surfaces are curved surfaces. Because the side surfaces of the housing 122 are curved, inserting the housing 122 mounted with the semiconductor laser device 101 into, for example, a cylindrical hole would allow the semiconductor laser device 101 and the housing 122 to be rotated, with the semiconductor laser device 101 and the housing 122 supported by the hole during the rotation. Therefore, the position of emission of laser light from the laser chip 105 can easily be adjusted.

Moreover, it is needless to say that the housing 122 has a metallic contact surface with which the greater part of the back surface of the heat sink 103 is put in surface contact. Therefore, the optical pickup device of the present embodiment produces an effect similar to that of the optical pickup device of the third embodiment.

In the fourth embodiment, it is acceptable to put roughly the entire back surface of the heat sink 103 in surface contact with the metallic contact surface of the housing 122.

Moreover, it is acceptable to subject the back surface of the heat sink 103 and/or the contact surface of the housing 122 to surface treatment for improving the wettability of the metallic brazing material. For example, as one example of the surface treatment, Ag (silver) plating may be applied to the back surface of the heat sink 103 and/or the contact surface of the housing 122.

Fifth Embodiment

Figure 12:
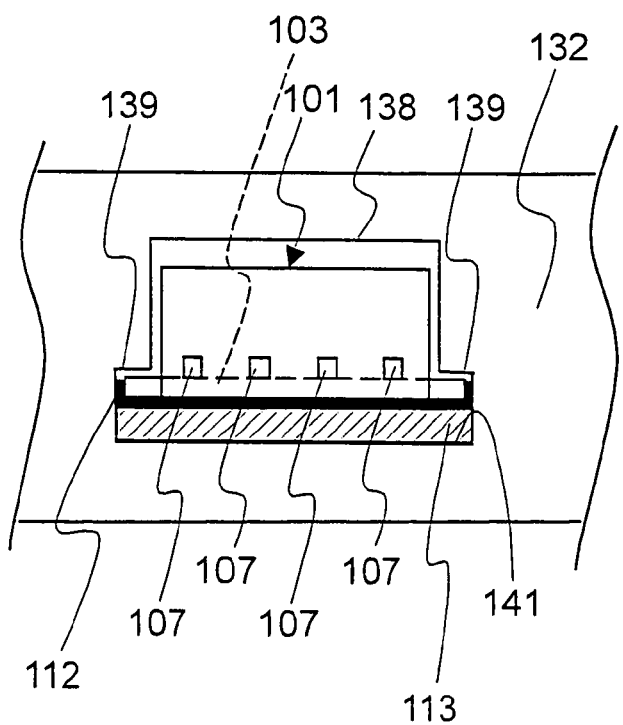
FIG. 12 is a schematic view of a semiconductor laser device and a housing in an optical pickup device of a fifth embodiment of the present invention as viewed from behind.

FIG. 12 shows a schematic view of an optical pickup device of a fifth embodiment of the present invention, as viewed from behind, in a state that the semiconductor laser device 101 is fixed to a housing 132. In FIG. 12, the same constituents as those of the third embodiments shown in FIGS. 10A-10D are denoted by the same reference numerals as those of the constituents of FIGS. 10A-10D, and no description is provided therefor. Moreover, in FIG. 12, solder 112, which is not shown in FIGS. 10A-10D, is shown.

The optical pickup device of the fifth embodiment has a metal housing 132 provided with a hollow portion 138 and grooves 139. Part of wall surfaces of the grooves 139 and part of a wall surface of the hollow portion 138 constitute a metallic contact surface 141. A semiconductor substrate 113 as one example of the substrate is arranged between the contact surface 141 and the back surface of the heat sink 103. The greater part of the back surface of the heat sink 103 is put in surface contact with a front surface of the semiconductor substrate 113. Moreover, the greater part of the back surface of the semiconductor substrate 113 is put in surface contact with the contact surface 141 of the housing 132. Although not shown, a pattern is provided on the surface of the semiconductor substrate 113 for allowing the semiconductor laser device 101 to be mounted thereto with solder 112.

According to the optical pickup device of the construction, the greater part of the back surface of the heat sink 103 is put in surface contact with the front surface of the semiconductor substrate 113, and the greater part of the back surface of the semiconductor substrate 113 is put in surface contact with the contact surface 141 of the housing 132. With this arrangement, heat escapes from the greater part of the heat sink 103 to the housing 132 via the semiconductor substrate 113, and therefore, the quantity of heat discharge by the heat sink 103 is great. Also, heat in the neighborhood of the laser chip 105 (see FIG. 10A) escapes to the housing 132 via the semiconductor substrate 113. Therefore, the semiconductor laser device 101 has an improved heat dissipation property.

Moreover, since the semiconductor substrate 113 is arranged between the back surface of the heat sink 103 and the contact surface 141 of the housing 132, another semiconductor device can be mounted on the semiconductor substrate 113. For example, a semiconductor laser chip that emits laser light of a wavelength different from that of the laser chip 105 may be mounted on the semiconductor substrate 113.

In the fifth embodiment, the greater part of the back surface of the heat sink 103 is put in surface contact with the front surface of the semiconductor substrate 113, and the greater part of the back surface of the semiconductor substrate 113 is put in surface contact with the contact surface 141 of the housing 132. However, it is acceptable to put roughly the entire back surface of the heat sink 103 in surface contact with the surface of the semiconductor substrate 113 and put roughly the entire back surface of the semiconductor substrate 113 in surface contact with the contact surface 141 of the housing 132.

Moreover, it is acceptable to subject the back surface of the heat sink 103 to a surface treatment for improving the wettability of the metallic brazing material. For example, as one example of the surface treatment, Ag (silver) plating may be applied to the back surface of the heat sink 103.

Moreover, the pickup device of the present invention may be provided by appropriately combining the third through fifth embodiments with one another.

Sixth Embodiment

Figure 13:
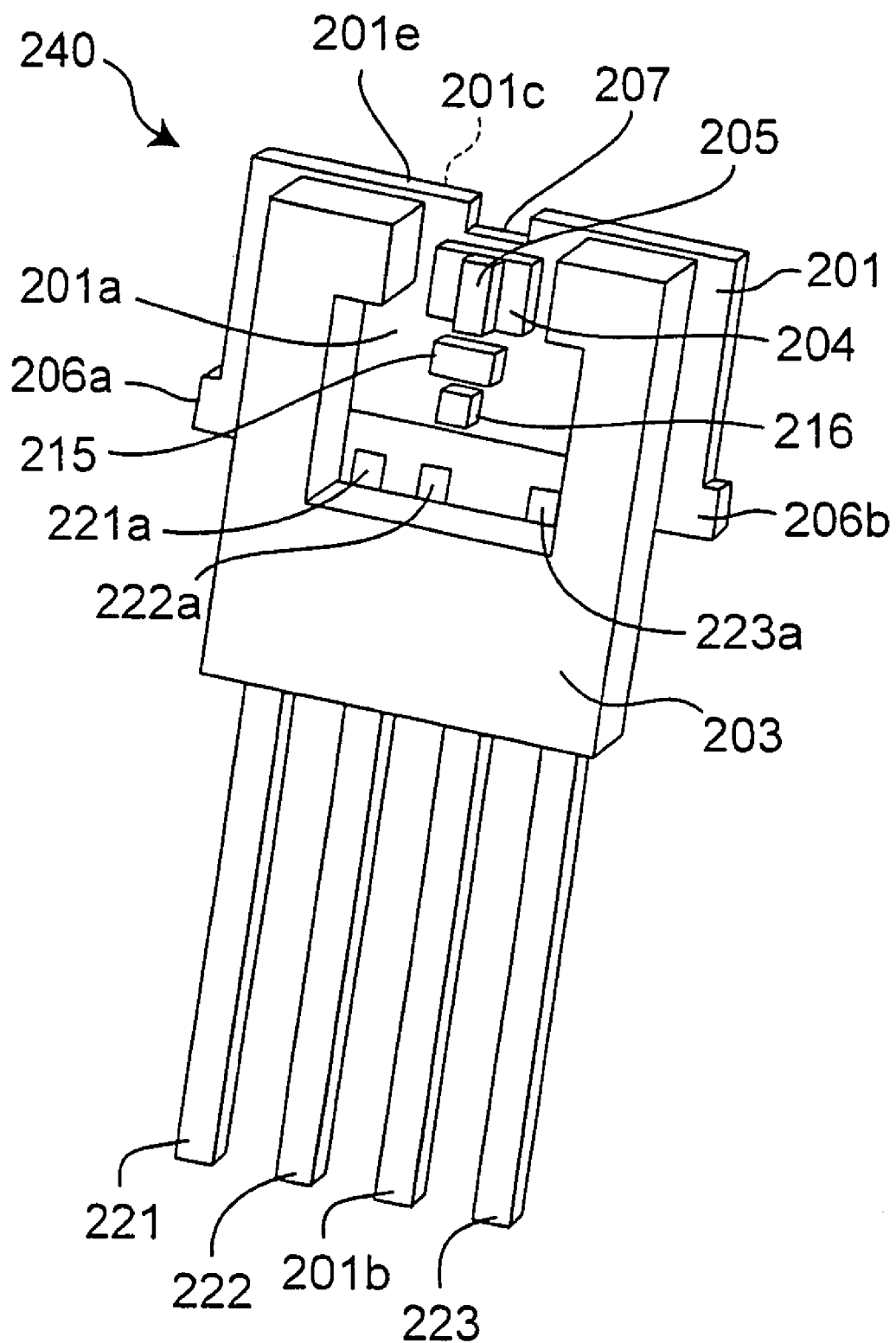
FIG. 13 is a perspective view showing the schematic construction of a semiconductor laser device of a sixth embodiment of the present invention.

FIG. 13 shows a perspective view of a frame type semiconductor laser device 240 of one embodiment of the present invention. FIG. 14A shows the semiconductor laser device 240 as viewed from above. FIG. 14B shows the device of FIG. 14A as viewed from the right-hand side. FIG. 14C shows the device of FIG. 14A as viewed from below. It is noted that the vertical and transverse directions of the semiconductor laser device 240 of the embodiment are specified just for the sake of convenience of explanation.

As shown in FIGS. 13 and 14A, the frame type semiconductor laser device 240 includes a first lead 201 that has a mounting portion 201a on which a laser chip 205 is to be mounted, a plurality of second leads 221, 222 and 223 for signal input and output, and a resin portion 203 that serves as a retention portion for integrally retaining the first lead and the second leads 221, 222 and 223.

In concrete, the first lead 201 has a roughly rectangular plate-like mounting portion 201a, an elongated lead portion 201b extending from the mounting portion 201a, and tie bar portions 206a and 206b projecting from the mounting portion 201a along a back surface 201c of the mounting portion 201a. A semiconductor laser chip ("laser chip") 205 is mounted on the mounting portion 201a via a rectangular plate-like submount member 204. The laser chip 205 has a rectangular parallelepiped external shape elongated in the direction of the optical axis and emits laser light forward (upward in FIG. 14A). The submount member 204 is constructed of a metal in this example.

A monitoring photodetector 215 separate from the submount member 204 is placed on the mounting portion 201a in a position behind the laser chip 205. Further, a light reflector 216 separate from the monitoring photodetector 215 and the resin portion 203 is placed on the mounting portion 201a in a position behind the monitoring photodetector 215.

The monitoring photodetector 215 is constructed of a roughly rectangular parallelepiped photodiode chip formed by diffusing impurities in a Si substrate in this example.

The light reflector 216 is constructed of a white resin formed in a roughly rectangular parallelepiped shape in this example. The light reflector 216 is easily formed by resin molding using a metal mold. The light reflector 216 has a reflection surface perpendicular to the laser light emitting direction (vertical direction in FIG. 14A) of the laser chip 205 and operates to receive part of the laser light emitted backward from the laser chip 205 and reflect the same toward the monitoring photodetector 215.

The resin portion 203 is made of a black insulative resin material of, for example, epoxy resin in this example. Therefore, the resin portion 203 is easily formed by the resin molding technique using a metal mold.

As shown in FIG. 14C, the back surface 201c of the mounting portion 201a is exposed from the resin portion 203. Moreover, the second leads 221, 222 and 223 are elongated along the lead portion 201b of the first lead 201. As shown in FIG. 13, inner ends 221a, 222a and 223a of the second leads 221, 222 and 223 are exposed inside of the resin portion 203 formed into a frame-like shape. Then, Au wires (not shown) are provided from the laser chip 205 and the monitoring photodetector 215 to the inner ends 221a, 222a and 223a of the second leads 221, 222 and 223.

As shown in FIGS. 13 and 14A, the first lead 201 has a recess portion 207 at the front edge 201e of the mounting portion 201a to indicate the mounting position of the laser chip 205. With this arrangement, it becomes easy to perform positioning of the submount member 204 and the laser chip 205 when placing the submount member 204 and the laser chip 205 on the mounting portion 201a in the manufacturing stage. For example, it is proper to adjust the position of the front edge of the submount member 204 along the edge of the recess portion 207.

Figure 15:
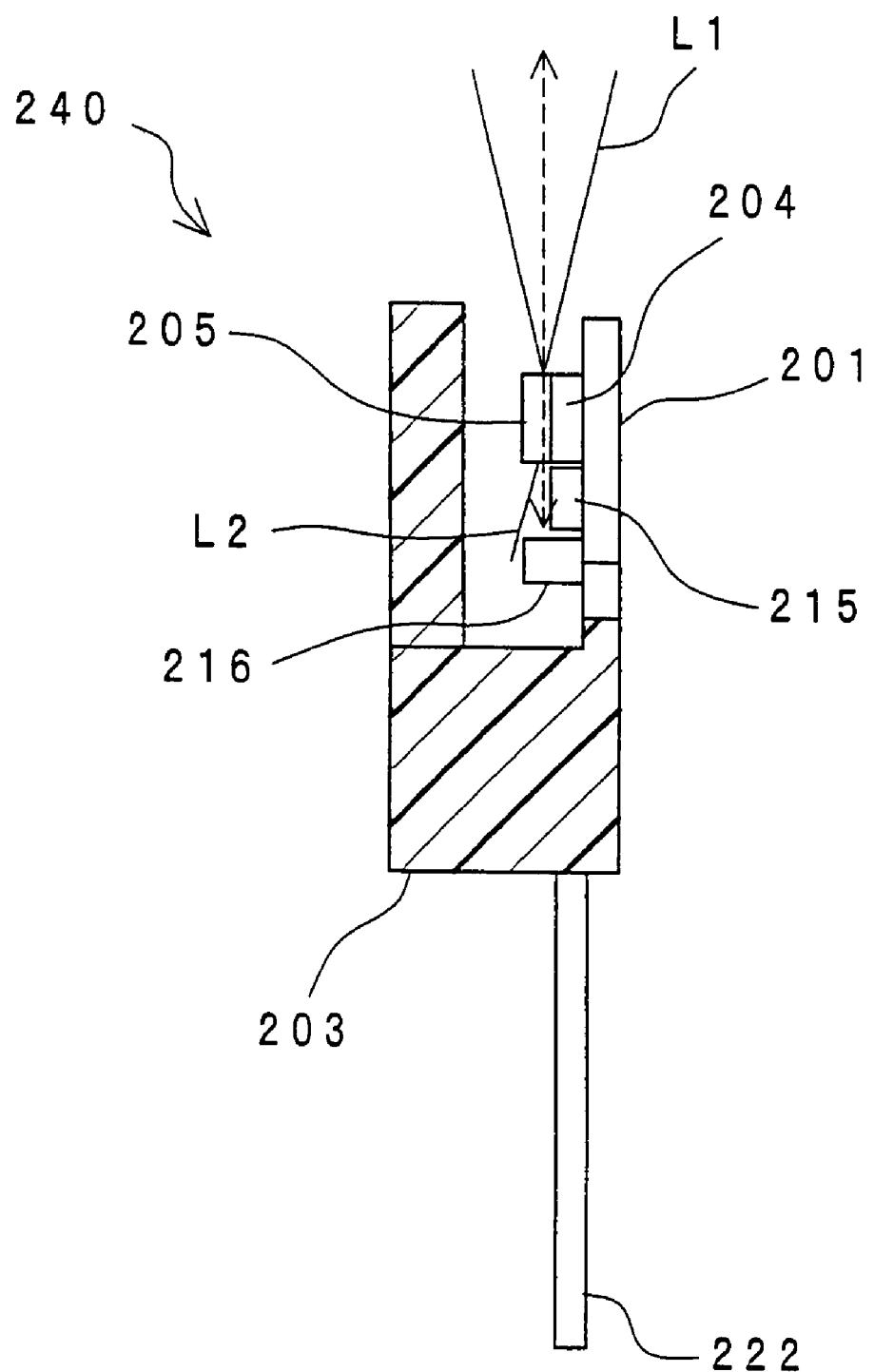
FIG. 15 is a sectional view of the semiconductor laser device.

Referring to FIG. 15, laser light L1 emitted forward (upward in FIG. 15) from the laser chip 205 is used for the intended purpose of the semiconductor laser device 240. For example, when the semiconductor laser device 240 is incorporated into an optical pickup device (not shown), the laser light is used to illuminate an optical disk.

Part of the laser light L2 emitted backward from the laser chip 205 is directly incident on the monitoring photodetector 215. However, the greater part of the laser light L2 emitted backward from the laser chip 205 is incident on the light reflector 216. The light reflector 216 reflects the incident laser light toward the monitoring photodetector 215. Therefore, the quantity of light incident on the monitoring photodetector 215 becomes greater than when the light reflector 216 is not provided. Particularly, in this example, the light reflector 216 is white, and therefore, the received light is reflected, and scarcely absorbed. Therefore, the quantity of light incident on the monitoring photodetector 215 is further increased. Moreover, the light reflector 216 is separated from the resin portion 203, and therefore, the light reflector 216 is not distorted even if a stress is applied to the resin portion 203 when, for example, the semiconductor laser device 240 is mounted on the optical pickup device. Therefore, the quantity of light incident on the monitoring photodetector 215 is stabilized. As a result, the laser light L1 emitted forward from the laser chip 205 is satisfactorily controlled on the basis of the output of the monitoring photodetector 215.

Even if the resin itself constituting the light reflector 216 has a color (e.g., black) other than white, the quantity of light incident on the monitoring photodetector 215 can be increased and stabilized similarly to the above case when the surface is subjected to metal plating of silver or the like. Moreover, even if the light reflector 216 is made of a metal, a similar effect can be produced.

As described above, in the semiconductor laser device 240, the back surface 201c of the mounting portion 201a of the first lead 201 is exposed from the resin portion 203. Therefore, if the mounting portion 201a of the first lead 201 is brought in contact with the housing of, for example, an optical pickup device in a stage in which the semiconductor laser device is mounted on the optical pickup device, the mounting portion 201a works for heat dissipation during the operation of the laser chip 205. That is, heat generated by the laser chip 205 is released to the housing through the mounting portion 201a.

The semiconductor laser device 240 is fabricated in the following manner.

Figure 16:
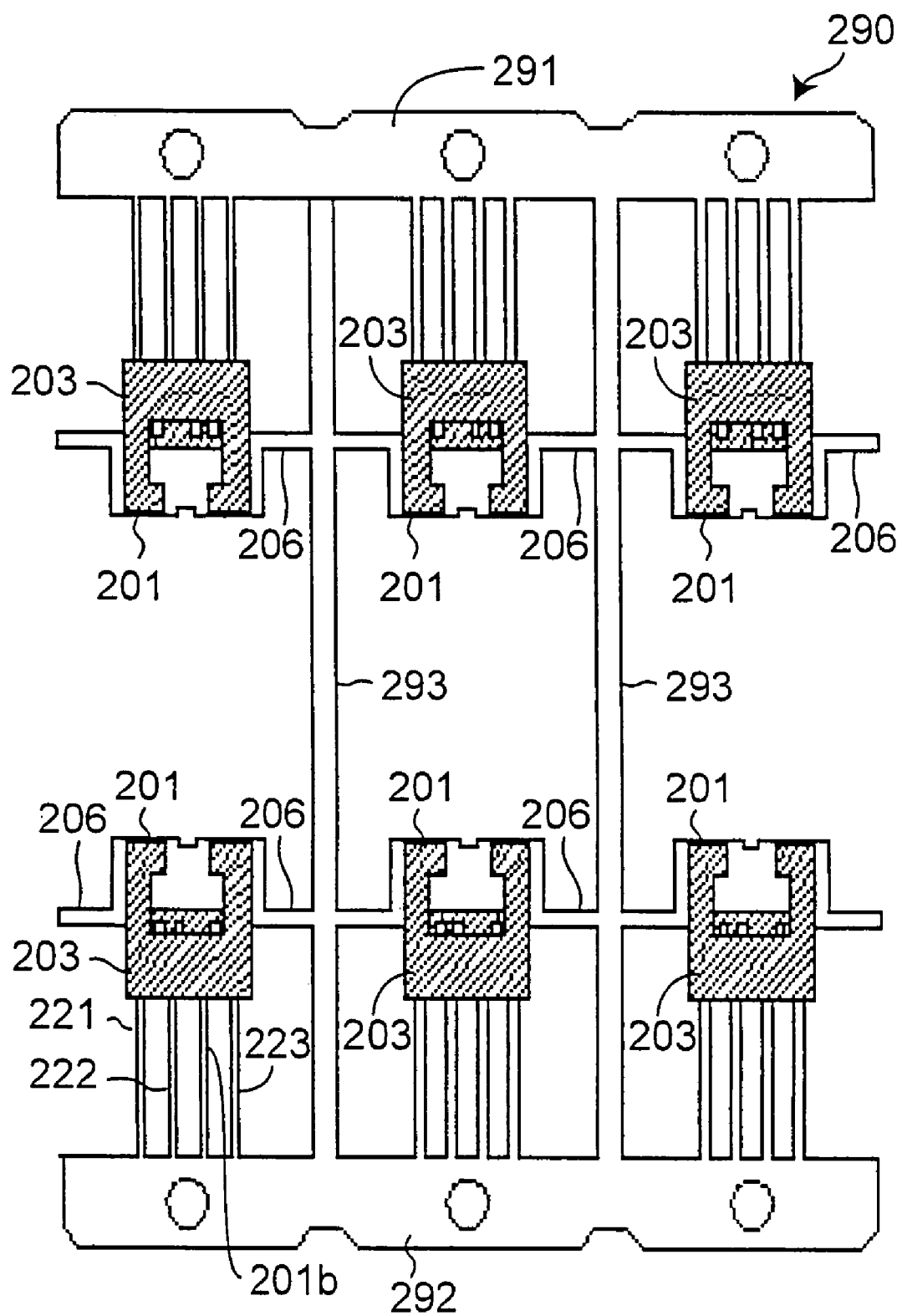
FIG. 16 is a view showing a resin-molded frame used for fabricating the semiconductor laser device.

First, as shown in FIG. 16, a frame 290 made of Cu is prepared. At the frame 290, a plurality of sets of the first lead 201 and the second leads 221, 222 and 223 for constituting the semiconductor laser device 240 are arranged in two lines along bars 291 and 292 extended in the transverse, or lateral direction in FIG. 16. The bars 291 and 292 are joined together via connection bars 293. Moreover, the mounting portions 201a of adjoining first leads 201 are joined together via tie bars 206. Then, the resin portions 203 are formed for each set of the first lead 201 and the second leads 221, 222 and 223 by resin molding technique using a metal mold.

In this state, the laser chip 205 is mounted on the mounting portion 201a of the first leads 201 via the submount member 204, and the monitoring photodetector 215 and the light reflector 216 are also mounted (die bonding process). The submount members 204, the monitoring photodetectors 215 and the light reflectors 216 should desirably be concurrently bonded onto the mounting portion 201a for the sake of process simplification.

Next, Au wires are placed from the laser chip 205 and the monitoring photodetector 215 to the inner ends 221a, 222a and 223a of the second leads 221, 222 and 223 (wire bonding process).

It is preferable to provide a cover for protecting the laser chip 205 on the resin portion 203 in this stage.

Next, individual semiconductor laser devices 240 are obtained by cutting the lead portions 201b of the first leads 201 and the second leads 221, 222 and 223 in the neighborhood of the bars 291 and 292, and also cutting the tie bars 206 (tie bar cutting process).

The semiconductor laser device 240 is simply fabricated through the described process steps.

Although the material of the retention portion is an insulative resin in the above example, the material may be ceramic. If the material of the retention portion is ceramic, the heat dissipation property can be further improved.

Seventh Embodiment

Figure 17:
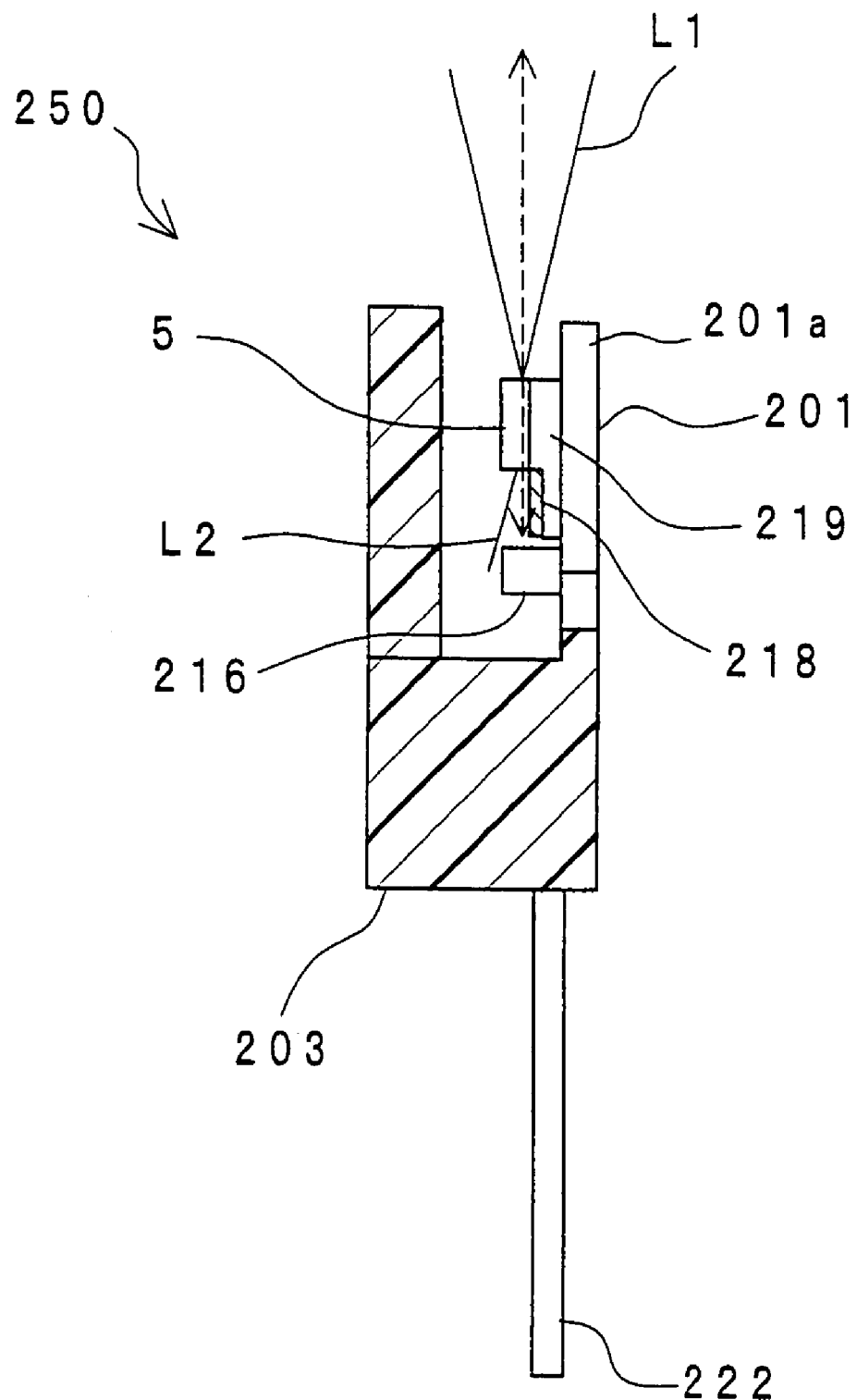
FIG. 17 is a view showing a semiconductor laser device of a seventh embodiment that has a submount provided with a built-in photodetector.

FIG. 17 shows a semiconductor laser device 250 of the seventh embodiment obtained by modifying the semiconductor laser device 240. The same constituent parts as those of FIG. 13 are denoted by the same reference numerals, and no description is provided for such constituent parts.

The semiconductor laser device 250 differs from the semiconductor laser device 240 in that the monitoring photodetector 218 is combined with a plate-like submount 219 made of Si, instead of being provided as a single component. In detail, the laser chip 205 is mounted at a forward portion of the submount 219, and the monitoring photodetector 218 is formed on the submount 219 in a position behind the laser chip 205. The photodetector 218 is formed by diffusing impurities at the surface of a Si substrate by a well-known technique.

Even in the semiconductor laser device 250, the quantity of light incident on the monitoring photodetector 218 is increased by virtue of the light reflector 216. Moreover, because the light reflector 216 is separated from the resin portion 203, the light reflector 216 is not distorted even if a stress is applied to the resin portion 203 when, for example, mounting the semiconductor laser device on the optical pickup device. Thus, the quantity of light incident on the monitoring photodetector 218 is stabilized. As a result, the laser light L1 emitted forward from the laser chip 205 is satisfactorily controlled on the basis of the output of the monitoring photodetector 218. Moreover, the parts count can be reduced in comparison with the case where the submount and the monitoring photodetector are provided separately from each other.

Figure 18:
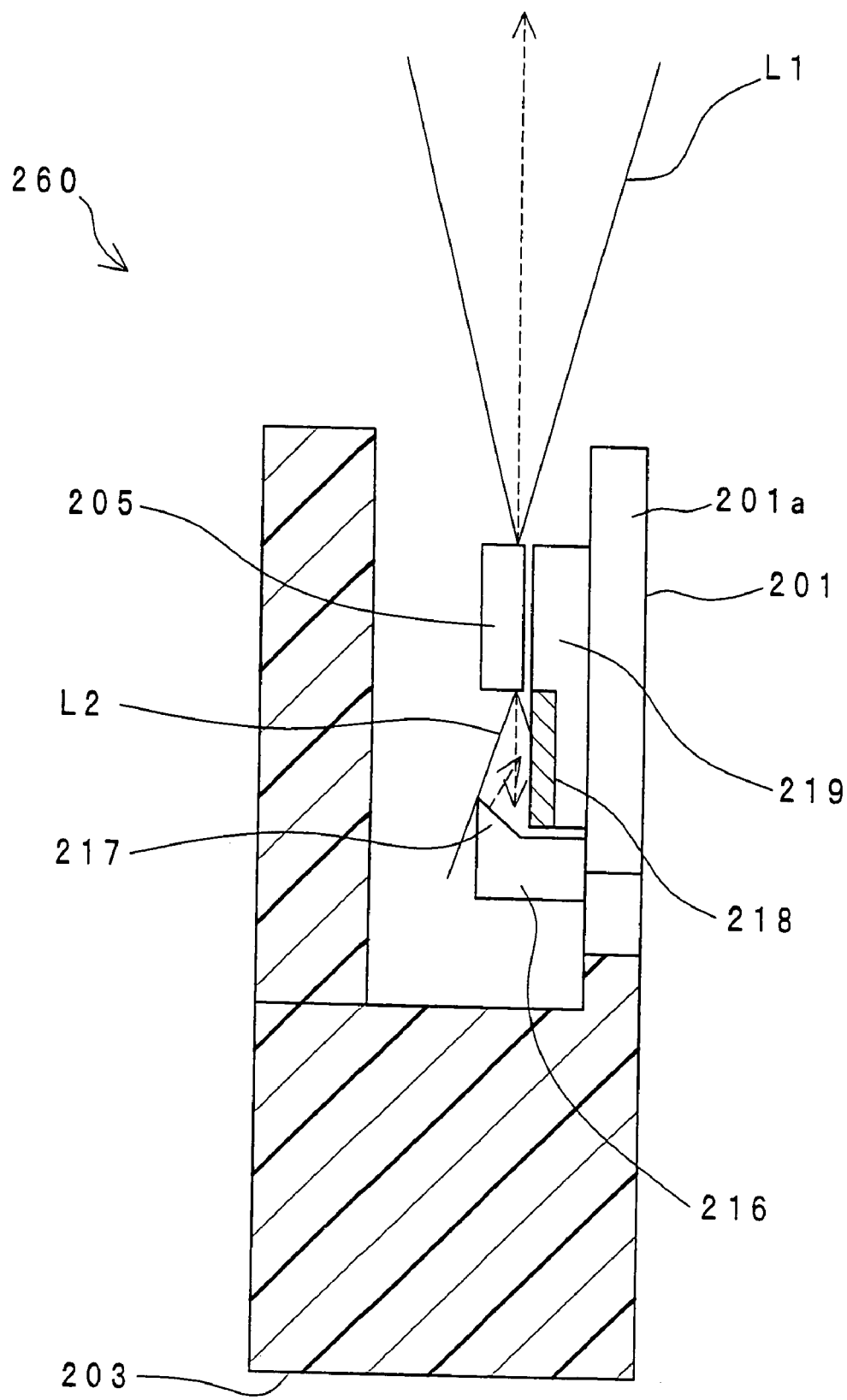
FIG. 18 is a view showing a modification example in which a light reflector is provided with an inclined surface in the semiconductor laser device of FIG. 17.

FIG. 18 shows yet another semiconductor laser device 260 obtained by modifying the semiconductor laser device 250 of FIG. 17.

The semiconductor laser device 260 differs from the semiconductor laser device 250 of FIG. 17 in that the light reflector 216 of the laser device 260 has a reflection surface 217 inclined with respect to the laser light emitting direction (vertical direction in FIG. 18) of the laser chip 205 so that the laser light L2 emitted from the laser chip 205 is reflected toward the monitoring photodetector 218. By virtue of the reflection surface 217, the quantity of light incident on the monitoring photodetector 218 can be increased. Moreover, the quantity of light incident on the monitoring photodetector 218 can be adjusted according to the angle of inclination.

Figure 19:
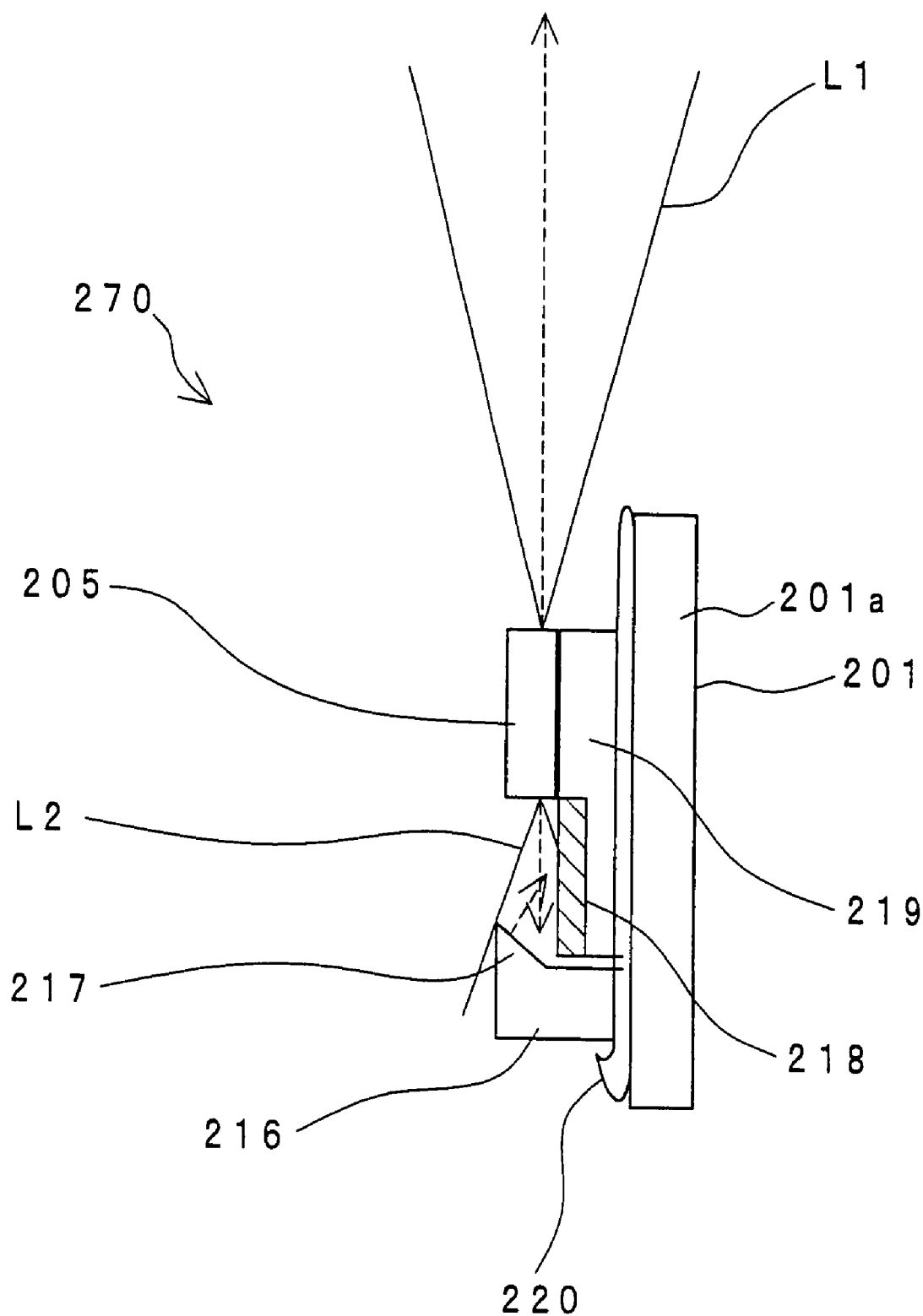
FIG. 19 is a view showing another modification example of the semiconductor laser device of FIG. 17.

FIG. 19 shows a modification example 270 in which a silver paste 20 is used as an adhesive for bonding the light reflector 216 to the mounting portion 201a of the first lead 201 in the semiconductor laser device 260 of FIG. 18. In the modification example 270, a plate-like Si submount 219, which has the built-in monitoring photodetector 218 and on which the laser chip 205 is mounted, and the light reflector 216 are bonded to the mounting portion 201a via a layer of silver paste 220.

According to the construction, it becomes possible to concurrently bond the submount 219 and the light reflector 216 to the mounting portion 201a. In detail, the silver paste 220 is applied by a specified amount to the mounting portion 201a of the first lead 201 by means of a dispenser or the like in the die bonding process, and the submount 219 and the light reflector 216 are placed on the silver paste 220. Subsequently, they are heated in an oven or the like and concurrently hardened. Through the processes, the semiconductor laser device 270 can be fabricated easier than when the submount 219 and the light reflector 216 are separately mounted on the mounting portion 201a.

Eighth Embodiment

Figure 20:
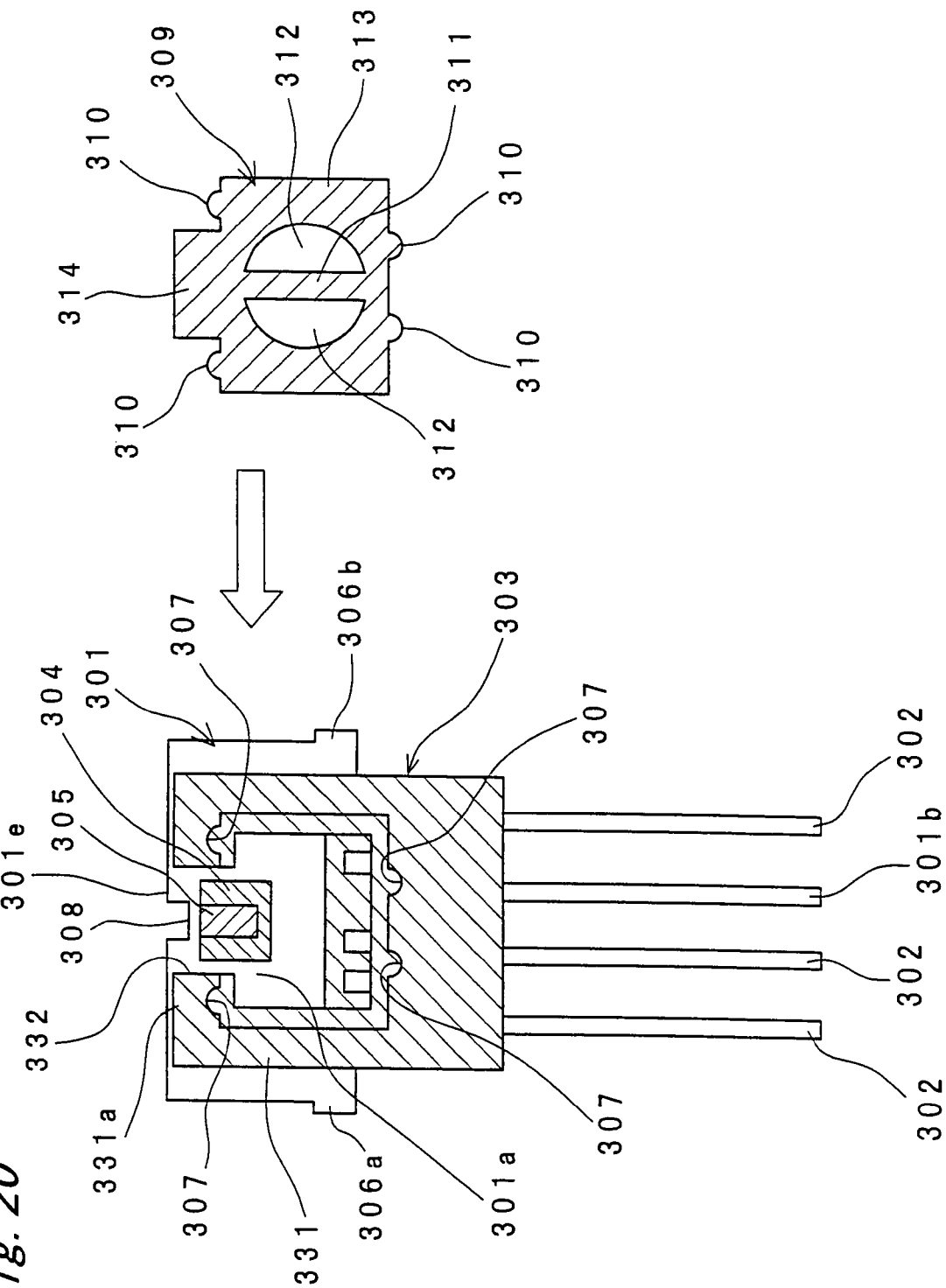
FIG. 20 is a front view showing a semiconductor laser device of an eighth embodiment of the present invention in a state before a cap is press fit.
Figure 21:
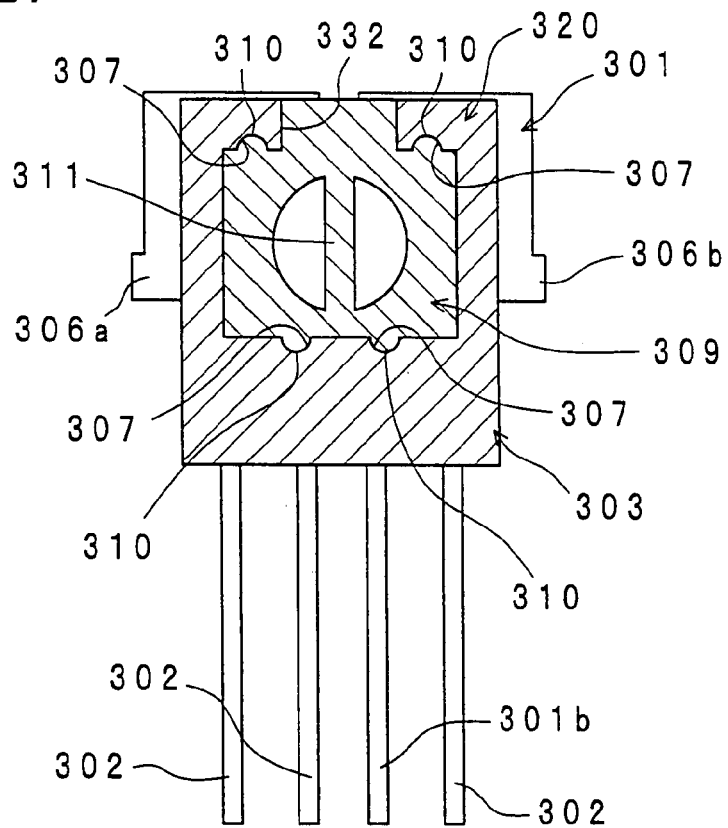
FIG. 21 is a front view showing the semiconductor laser device of the present invention in a state in which the cap has been press fit.
Figure 22:
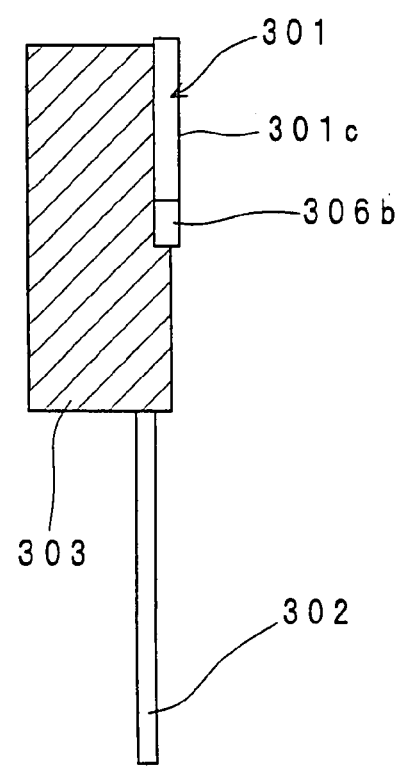
FIG. 22 is a side view showing the semiconductor laser device of the present invention in the state in which the cap has been press fit.

FIG. 20 shows a front view of a semiconductor laser device of one embodiment of the present invention. More specifically, FIG. 20 shows a front view of the semiconductor laser device of the present invention in a state before a cap is pressed into place. FIG. 21 shows a front view of the semiconductor laser device of the present invention in a state in which the cap is press fit, and FIG. 22 shows a side view of the semiconductor laser device of the present invention in a state in which the cap is press fit. It is noted that the hatching in the figure intends not to illustrate the cross section of parts but to highlight the parts for the sake of easier recognition.

The semiconductor laser device is a so-called frame type semiconductor laser device and includes a first lead 301 that has a mounting portion 301a on which the laser chip 305 is mounted, a plurality of second leads 302 for signal input and output, a retention portion 303 that integrally retains the first lead 301 and the second leads 302, and a cap 309 that is attached to the retention portion 303 and protects the laser chip 305.

In concrete, the first lead 301 has a roughly rectangular plate-like mounting portion 301a, an elongated lead portion 301b extending from the mounting portion 301a, and tie bar portions 306a and 306b that project in the transverse, or lateral direction from the right-hand and left-hand edges of the mounting portion 301a along the back surface 301c of the mounting portion 301a. The laser chip 305 is mounted on the mounting portion 301a via a rectangular plate-like submount member 304. The laser chip 305 has a rectangular parallelepiped external shape elongated in the direction of the optical axis and emits laser light forward (upward in FIG. 20).

Herein, the transverse, or lateral direction means a direction perpendicular or roughly perpendicular to the optical axis of the laser chip 305, and corresponds to the lateral direction in FIG. 20. Moreover, the front-rear (back) direction means a direction of the optical axis of the laser chip, and corresponds to the vertical direction in FIG. 20.

The back surface 301c (the surface opposite from the surface on which the laser chip 305 is mounted) of the mounting portion 301a is exposed from the retention portion 303. The tie bar portions 306a and 306b each have in the projecting direction an end located in a position farther away from the laser chip 305 than any arbitrary portion of the mounting portion 301a. The width (width in the direction perpendicular to the projecting direction) of the tie bar portions 306a and 306b is greater than the width of the laser chip 305 (width in the direction perpendicular to the optical axis of the laser light emitted from the laser chip 305).

As described above, the back surface 301c of the mounting portion 301a of the first lead 301 is exposed from the retention portion 303, and the tie bar portions 306a and 306b project from the mounting portion 301a along the back surface 301c of the mounting portion 301a. Moreover, the areas of the tie bar portions 306a and 306b more than a certain extent are secured. Therefore, if the back surface 301c of the mounting portion 301a of the first lead 301 and the tie bar portions 306a and 306b are brought in contact with the housing of the optical pickup device in a stage in which the semiconductor laser device is mounted on, for example, an optical pickup device, the tie bar portions 306a and 306b work for heat discharge together with the mounting portion 301a during the operation of the laser chip. That is, heat generated by the laser chip 305 is released to the housing through the mounting portion 301a and the tie bar portions 306a and 306b. That is, the heat discharge area is broadened, and the heat dissipation property is improved.

A positioning recess portion 308 that recedes so as to indicate the mounting position of the laser chip 305 is provided at the front edge 301e of the mounting portion 301a. With this arrangement, it becomes easy to perform positioning of the submount member 304 and the laser chip 305 when mounting the submount member 304 and the laser chip 305 on the mounting portion 301a in the manufacturing stage. For example, it is proper to align the front edge of the submount member 304 along the edge of the positioning recess portion 308.

The plurality of second leads 302 are elongated along the lead portion 301b of the first lead 301. The inner ends of the second leads 302 are exposed inside of the retention portion 303 formed in a frame-like shape. Au wires (not shown) are provided from the laser chip 305 or the submount member 304 to the inner ends of the second leads 302.

The retention portion 303 is made of a black insulative resin material, for example, epoxy resin in this example. Therefore, the retention portion 303 is easily formed by the resin molding technique using a metal mold.

The retention portion 303 has a frame member 331 on the laser chip 305 side of the mounting portion 301a, and the frame member 331 is formed with a window portion 332 for emission of laser light so that the laser light emitted from the laser chip 305 is not blocked.

In concrete, the frame member 331 has a roughly rectangular shape having front and rear parts and right-hand and left-hand parts. Then, the window portion 332 is formed partway at the front part 331a, and the submount member 304 and the laser chip 305 are arranged in the window portion 332.

The frame member 331 has two inner surfaces that are extended in a direction roughly perpendicular to the optical axis of the laser chip 305 and face each other, and each of the two inner surfaces has two recess portions 307 that recede in the direction roughly parallel to the optical axis of the laser chip 305. That is, the two recess portions 307 are arranged on the inner side of each of the front and rear parts of the frame member 331. The shape of the recess portions 307 is a shape corresponding to the outer periphery of a hemisphere.

In this example, the cap 309 is made of the same material as that of the retention portion 303, namely the black insulative resin material of, for example, epoxy resin. Therefore, the cap 309 is easily formed by the resin molding process using a metal mold.

The cap 309 has a roughly rectangular main body 313 to be attached to the inside of the frame member 331. The cap 309 also has a projection 314 that projects from the front edge of the main body 313 and is mated with the window portion 332 of the frame member 331. Thus, the laser chip 305 is reliably protected by the cap 309.

The cap 309 has two outer surfaces that are extended in a direction roughly perpendicular to the optical axis of the laser chip 305 and face each other, and two projections 310 projecting in the direction roughly parallel to the optical axis of the laser chip 305 are provided on each of the two outer surfaces. That is, the two projections 310 are arranged at each of the front and rear edges of the main body 313. The shape of the projections 310 is hemispheric. That is, the shape of the recess portions 307 is complementary to the shape of the projections 310.

As shown in FIG. 21, when the cap 309 is attached to the frame member 331 of the retention portion 303, the projections 310 and the recess portions 307 are engaged with each other and brought in pressure contact with each other, so that the frame member 331 of the retention portion 303 and the cap 309 are urged in opposite directions roughly parallel to the optical axis of the laser chip 305 and brought in pressure contact with each other. That is, a pressure contact means 320 is constituted essentially of the projections 310 and the recess portions 307.

The cap 309 has a lug 311 for handling. The lug 311 is formed so as to be directed in the direction roughly parallel to the optical axis of the laser chip 305 when the cap 309 is attached to the inside of the frame member 331 of the retention portion 303.

In concrete, the lug 311 is defined between two lug-forming recess portions 312 and 312 that are opposed to each other at an interval on one surface of the cap 309. The lug-forming recess portions 312 and 312 each have a generally crescentic shape, and the two lug-forming recess portions 312 and 312 are arranged so that their linear portions are opposed to each other.

According to the semiconductor laser device of the construction, when the cap 309 is fit into the frame member 331 of the retention portion 303, the frame member 331 of the retention portion 303 and the cap 309 are brought in pressure contact with each other by being urged in the direction roughly parallel to the optical axis of the laser chip 305 by the pressure contact means 320. Therefore, the cap 309 can be fit in the frame member 331 of the retention portion 303 by press fitting. At this time, a stress applied to the frame member 331 of the retention portion 303 is transmitted in the direction roughly parallel to the optical axis of the laser chip 305 when transmitted to the mounting portion 301a of the first lead 301. That is, the stress is absorbed by the portions except for the window portion 332 in the frame member 331 of the retention portion 303 (i.e., the portions are the right-hand and left-hand parts of the frame member 331 that have a great strength), and therefore, the stress is restrained from being transmitted to the mounting portion 301a of the first lead 301. Therefore, it is possible to prevent the first lead 301 (lead frame) from warping or bending even if the cap 309 is press fit to the frame member 331 of the retention portion 303.

Moreover, because the pressure contact means 320 has the projections 310 and the recess portions 307, which provides a simple structure, the cap 309 can reliably be positioned in place by being press fit to the frame member 331 of the retention portion 303.

Moreover, the shape of the projections 310 is hemispherical, and the shape of the recess portions 307 is complementary to the shape of the projections 310. Therefore, the stress can be evenly transmitted in a wide area, and an intense stress can be prevented from being locally applied.

Moreover, the two (four in total) projections 310 are arranged on each of the two outer surfaces of the cap 309, and the two (four in total) recess portions 307 are arranged on each of the two inner surfaces of the frame member 331 of the retention portion 303. Therefore, the stress can be evenly transmitted when the cap 309 is press fit to the frame member 331 of the retention portion 303.

Moreover, the cap 309 has the lug 311 for handling, and therefore, the cap 309 can easily be handled with tweezers or the like.

Moreover, the lug 311 is formed by providing the two lug-forming recess portions 312 and 312. That is, the lug 311 is formed by not forming a projection on the upper surface of the cap 309, and the thickness of the cap 309 is not increased, so that the thickness of the semiconductor laser device can be prevented from being increased.

Since the recess portions 312 for lug formation have a crescentic shape, it is easy to insert the ends of tweezers into the recess portions 312 and 312 when the lug 311 is handled, and good workability is obtained.

Figure 23:
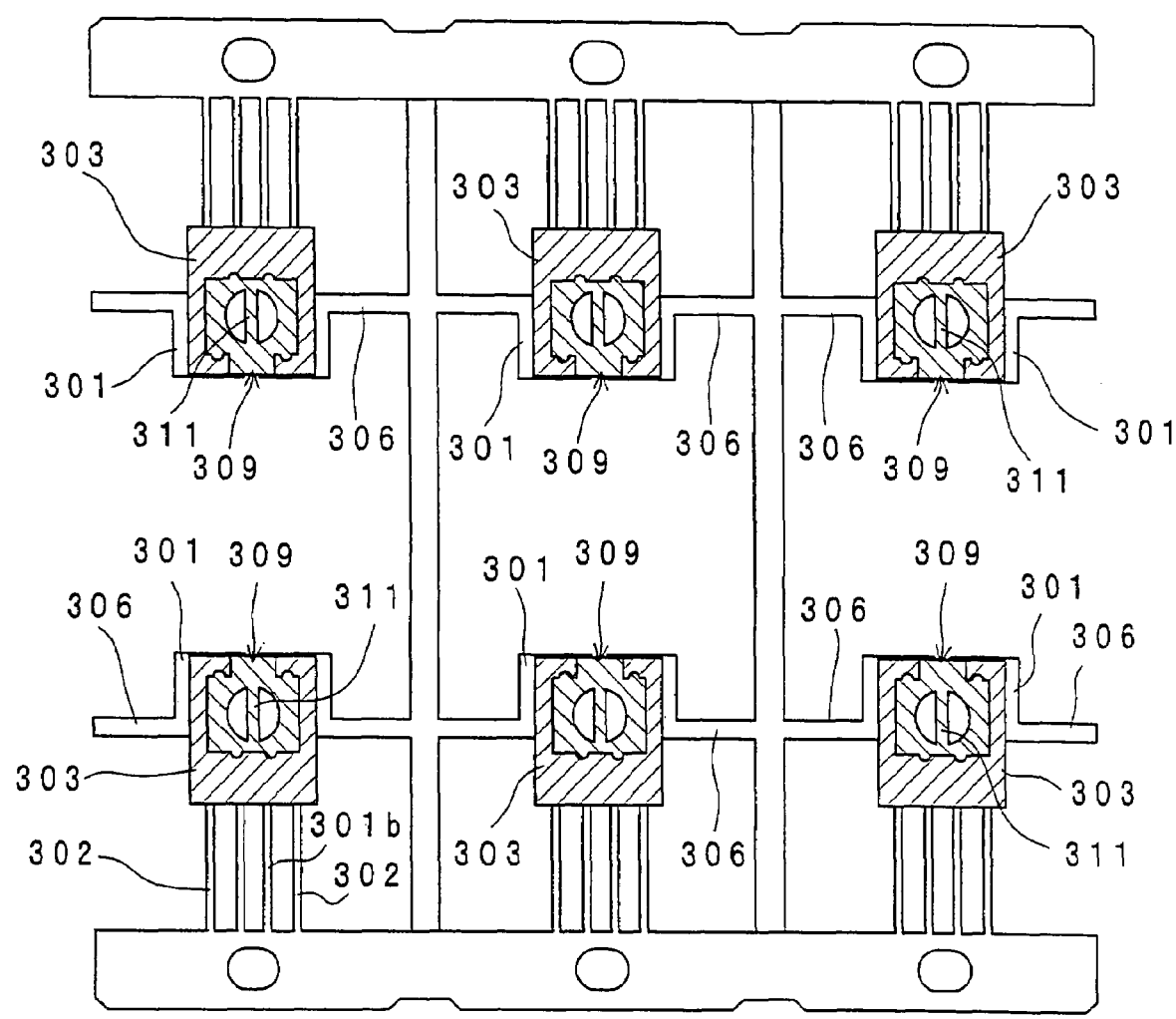
FIG. 23 is a front view showing a state of the semiconductor laser devices of the present invention in a manufacturing process in which the lead frames are connected together after the caps are press fit.

Moreover, the lug 311 of the cap 309 is formed so as to be directed in the direction roughly perpendicular to the right-hand and left-hand tie bar portions 306a and 306b when the cap 309 is fit into the frame member 331 of the retention portion 303. Therefore, as shown in FIG. 23, when the cap 309 is press fit to the retention portion 303 in manufacturing the semiconductor laser device, the lug 311 is directed in the direction roughly perpendicular to tie bars 306, which tie the adjoining first leads 301 and 301 (mounting portions 301a and 301a) together and make the plurality of first leads 301 extend in a liner form. Therefore, good workability is obtained in performing the press fitting of the cap 309 in the state in which the plurality of first leads 301 (lead frames) are joined together by the tie bars 306.

In concrete, when manually handling the cap 309 in the direction perpendicular to the tie bars 306 (from below the semiconductor laser device in FIG. 23) for press fitting while feeding the semiconductor laser devices in the direction parallel to the tie bars 306, the lug 311 is directed in the direction roughly perpendicular to the operator, so that the operator can press fit the cap 309 with his or her arms fit to the sides of his or her body. Therefore, the work is easy to perform, and the work space can be reduced.

Moreover, since the color of the retention portion 303 and the cap 309 is black, even if the return light from the object to which the laser light is applied (e.g., an information recording medium such as a disk) is incident on the retention portion 303 and/or the cap 309 during the operation of the laser chip 305, the return light is not reflected but absorbed by the retention portion 303 and/or the cap 309. As a result, the return light from the object to which the laser light is applied can be prevented from causing noises in the device (e.g., an optical pickup device) that employs the semiconductor laser device. That is, the laser light returning from the object of illumination with the laser light is prevented from irregularly reflecting, and the laser oscillation is prevented from becoming unstable. It is thus possible to prevent the proper signal from being disordered at the photodetector, which would be caused by entrance of light other than the proper signal into the photodetector for signal detection of the pickup.

It is noted that the present invention is not limited to the above embodiment. For example, although not shown, it is acceptable to provide a projection projecting in the direction roughly parallel to the optical axis of the laser chip at the frame member of the retention portion and provide a recess portion receding in the direction roughly parallel to the optical axis of the laser chip at the cap.

Ninth Embodiment

Figure 24A:
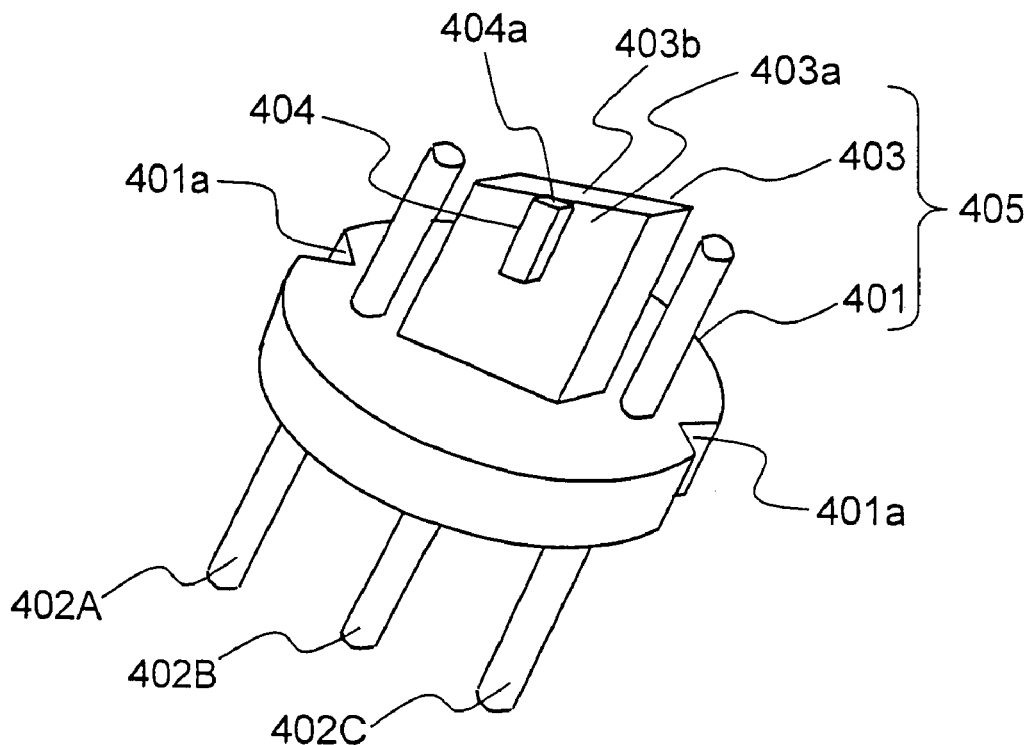
FIG. 24A is a schematic perspective view of a semiconductor laser device of a ninth embodiment of the present invention.

FIG. 24A schematically shows a perspective view of a semiconductor laser device of a ninth embodiment of the present invention.

The semiconductor laser device has a stem 405 made of a metal. The stem 405 has a disk-shaped base (eyelet) 401 and a metal support 403 provided on a top surface (stem reference surface) of the base 401.

The base 401 is provided with notches 401a at an interval of approximately 180° in the circumferential direction of the base. Moreover, three leads 402A, 402B and 402C are connected to the base 401. Of the three leads, two leads 402A and 402B penetrate the base 401 and the other lead 402C does not penetrate the base 401. The leads 402A and 402B are integrally fixed to the base 401 with a resin or glass that has an insulative property. With this arrangement, the leads 402A and 402B are electrically insulated from the base 401. On the other hand, the lead 402C is fixed to the back surface (the surface opposite from the stem reference surface) of the base 401 and electrically connected to the base 401. The metal support 403 is provided on the surface (stem reference surface) side of the base 401.

The metal support 403 has a mounting surface 403a and a front surface 403b adjoining the mounting surface 403a. The mounting surface 403a is roughly perpendicular to the front surface 403b. Moreover, a laser chip 404 is mounted on the mounting surface 403a, and laser light is emitted from a light-emitting end surface 404a on the front surface 403b side of the laser chip 404. The laser chip 404 is electrically connected to the lead 402B via an Au wire (not shown).

Figure 24B:
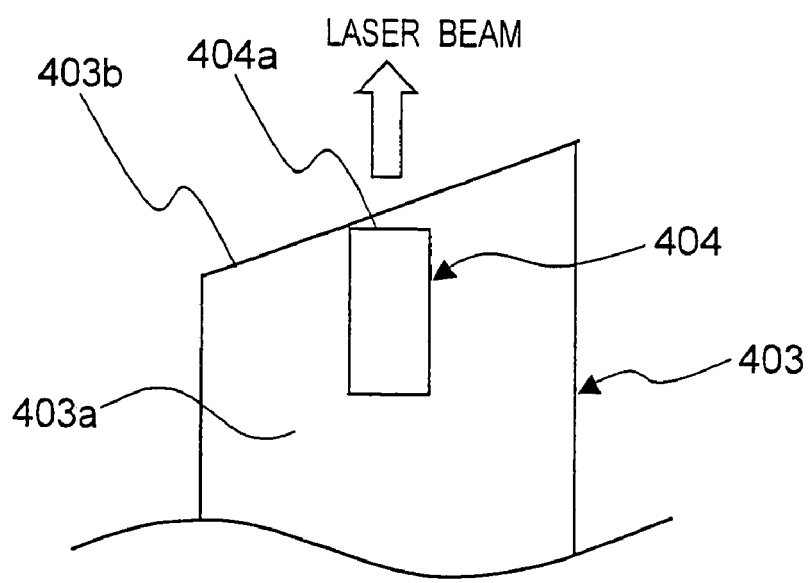
FIG. 24B is a schematic view of a metal support of the semiconductor laser device as viewed from the mounting surface side.

FIG. 24B schematically shows the metal support 403 as viewed from the mounting surface 403a side.

The front surface 403b of the metal support 403 is inclined with respect to the light-emitting end surface 404a of the laser chip 404. That is, the perpendicular line to the front surface 403b of the metal support 403 is inclined with respect to the laser light emitting direction of the laser chip 404. Moreover, the front surface 403b of the metal support 403 is parallel to a plane obtained by rotating the light-emitting end surface 404a of the laser chip 404 around the perpendicular line to the mounting surface 403a (line perpendicular to the sheet of FIGS. 24A and 24B).

When the semiconductor laser device of the above construction is employed as the light source of an optical disk apparatus, a laser beam emitted from the light-emitting end surface 404a of the laser chip 404 is split into one main beam and two sub-beams by a diffraction grating. The three beams are condensed on a surface of a loaded optical disk through an optical system including a collimating lens, an object lens and so on, to write information on the optical disk or read the signal contained in the optical disk. Then, the beams are reflected by the optical disk and returns to the semiconductor laser device. At this time, even if a sub-beam returning from the optical disk impinges on the front surface 403b of the metal support 403, the sub-beam reflected by the front surface 403b of the metal support 403 is not incident again on the surface of the optical disk since the front surface 403b of the metal support 403 is inclined with respect to the light-emitting end surface 404a of the laser chip 404. Therefore, the semiconductor laser device is prevented from exerting an adverse effect on the write characteristic of the optical disk apparatus and the signal control system of the pickup.

Moreover, because the front surface 403b of the metal support 403 is parallel to the plane obtained by rotating the light-emitting end surface 404a of the laser chip 404 around the perpendicular line to the mounting surface of the metal support 403, the front surface 403b of the metal support 403 can be used as a reference surface for positioning the laser chip 404. Therefore, using the front surface 403b of the metal support 403 as the reference surface facilitates the placement of the laser chip 404 in a prescribed position.

Tenth Embodiment

Figure 25A:
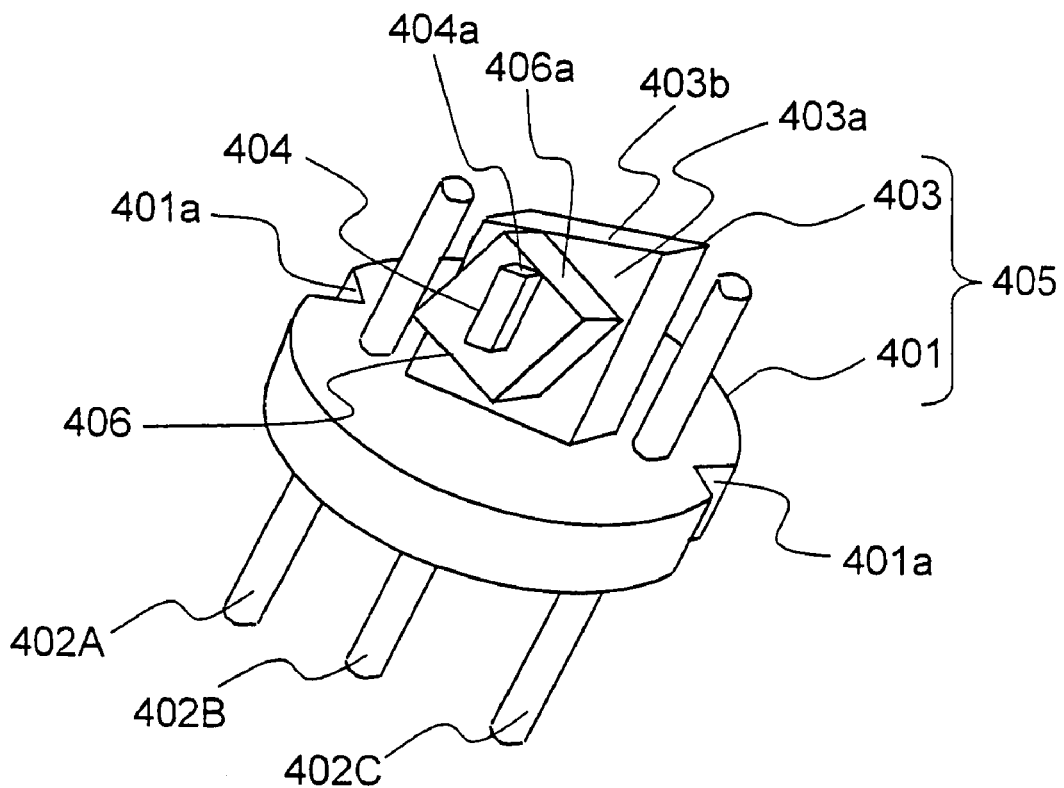
FIG. 25A is a schematic perspective view of a semiconductor laser device of a tenth embodiment of the present invention.
Figure 25B:
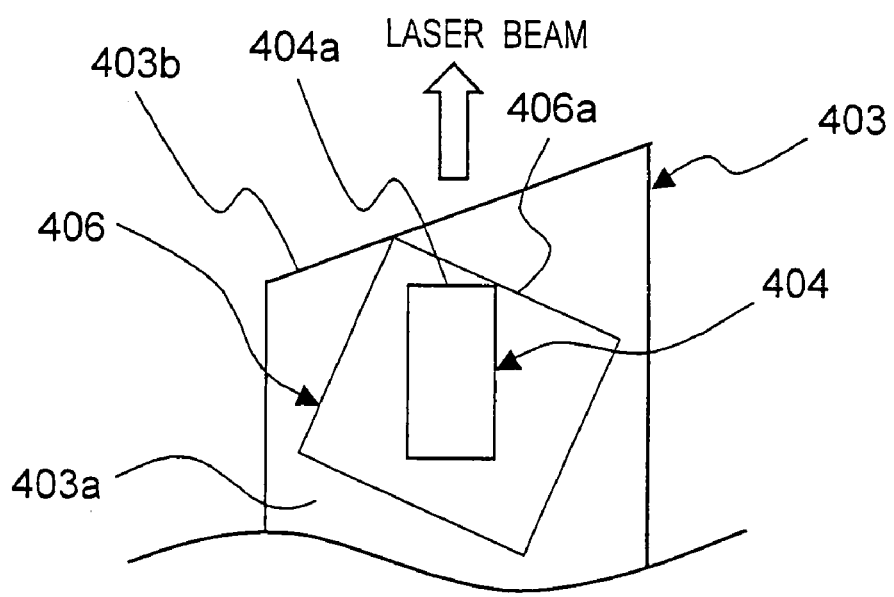
FIG. 25B is a schematic view of a metal support of the semiconductor laser device as viewed from the mounting surface side.

FIG. 25A schematically shows a perspective view of a semiconductor laser device of a tenth embodiment of the present invention, and FIG. 25B schematically shows the metal support 403 as viewed from the mounting surface 403a side. In FIGS. 25A and 25B, same constituent parts as those of the ninth embodiment shown in FIGS. 24A and 24B are denoted by the same reference numerals as those of the constituent parts of FIGS. 24A and 24B, and no description is provided therefor.

As shown in FIG. 25A, the semiconductor laser device has a submount 406 made of a dielectric substance or a semiconductor provided between the metal support 403 and the laser chip 404. As shown in FIG. 25B, an end surface 406a on the front surface 403b side of the submount 406 is inclined with respect to the light-emitting end surface 404a of the laser chip 404 and also inclined with respect to the front surface 403b of the metal support 403. That is, the perpendicular line to the end surface 406a of the submount 406 and the perpendicular line to the front surface 403b of the metal support 403 are inclined with respect to the laser light emitting direction of the laser chip 404. Moreover, the end surface 406a of the submount 406 is parallel to a plane obtained by rotating the light-emitting end surface 404a of the laser chip 404 around the perpendicular line to the mounting surface 403a (line perpendicular to the sheet of FIGS. 25A and 25B).

In the case where the semiconductor laser device of the above construction is employed as a light source of an optical disk apparatus, since the end surface 406a of the submount 406 and the front surface 403b of the metal support 403 are inclined with respect to the light-emitting end surface 404a of the laser chip 404, even if a sub-beam returning from the optical disk impinges on the end surface 406a of the submount 406 or the front surface 403b of the metal support 403, the sub-beam is prevented from being redirected to the optical disk. Therefore, the semiconductor laser device is prevented from exerting an adverse effect on the write characteristic of the optical disk apparatus and the signal control system of the pickup. That is, the semiconductor laser device of the present embodiment produces an effect similar to that of the ninth embodiment.

Eleventh Embodiment

Figure 26:
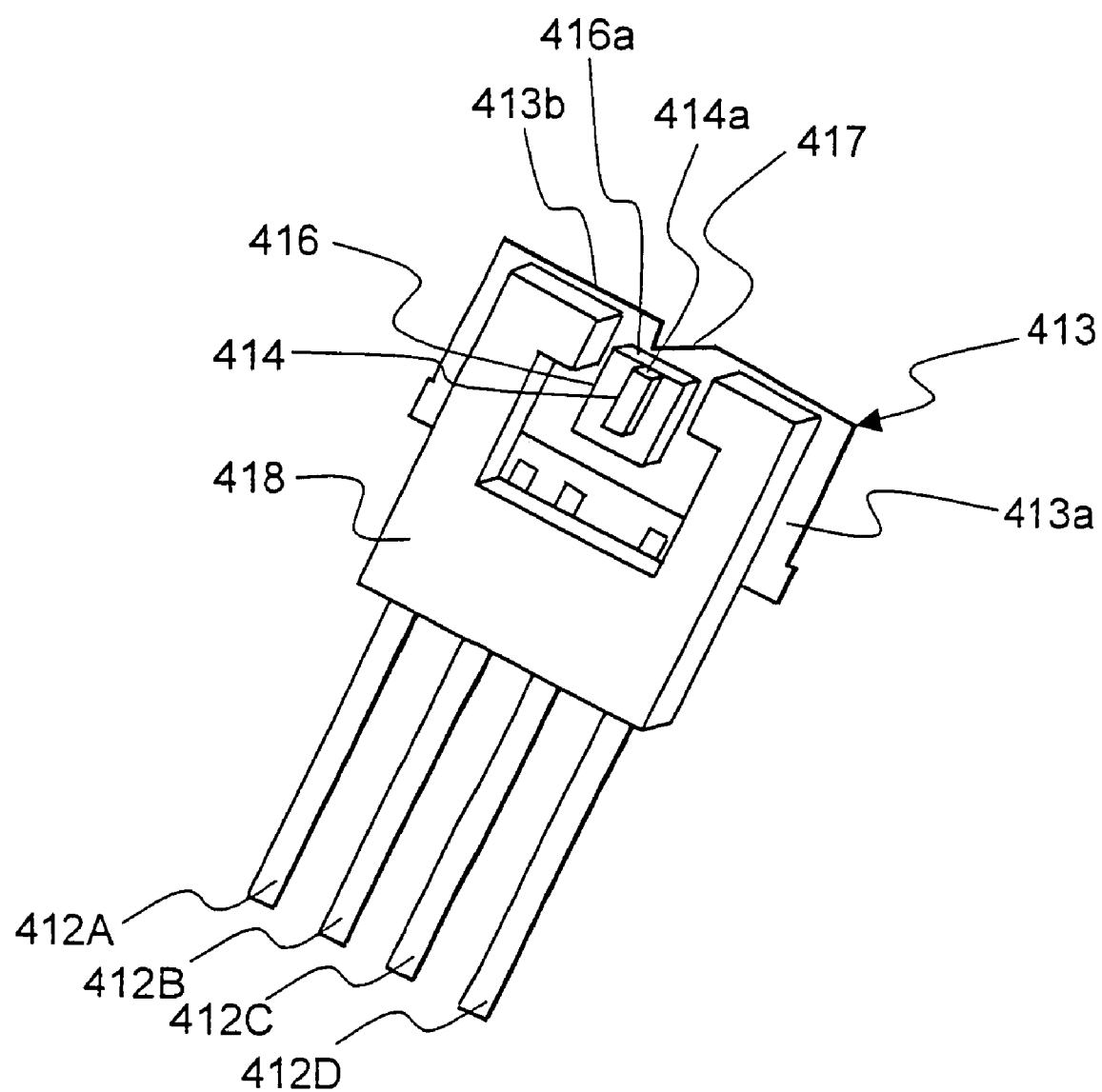
FIG. 26 is a schematic perspective view of a semiconductor laser device of an eleventh embodiment of the present invention.

FIG. 26 shows a perspective view of a semiconductor laser device of an eleventh embodiment of the present invention. The semiconductor laser device is called a frame laser.

The semiconductor laser device has a metal thin plate 413 that serves as a frame, a submount 416 provided on the metal thin plate 413, and a laser chip 414 provided on the submount 416. Laser light is emitted from a light-emitting end surface 414a of the laser chip 414. Moreover, leads 412A, 412B, 412C and 412D are connected to the metal thin plate 413 via an insulative resin.

The metal thin plate 413 has a mounting surface 413a and a front surface 413b adjoining the mounting surface 413a. The mounting surface 413a is roughly perpendicular to the front surface 413b. Moreover, the front surface 413b of the metal thin plate 413a has a notch 417, which is located in the neighborhood of the laser chip 414. End surfaces defining the notch 417 are inclined with respect to the light-emitting end surface 414a of the laser chip 414. However, those end surfaces are parallel to a plane obtained by rotating the light-emitting end surface 414a of the laser chip 414 around a perpendicular line to the mounting surface 413a.

An end surface 416a of the submount 416 on the notch 417 side is roughly parallel to the light-emitting end surface 414a of the laser chip 414. Moreover, the end surface 416a of the submount 416 is inclined with respect to the end surfaces defining the notch 417.

When the semiconductor laser device of the above construction is employed as a light source of an optical disk apparatus, since the notch 417 is provided at the front surface 413b of the metal thin plate 413, even if a sub-beam returning from a loaded optical disk impinges on the end surface 416a of the submount 416 and the front surface 413b of the metal thin plate 413, the sub-beam can be prevented from being redirected to the optical disk. Therefore, the semiconductor laser device can be prevented from exerting an adverse effect on the write characteristic of the optical disk apparatus and the signal control system of the pickup.

The laser light emitted from the light-emitting end surface 414a of the laser chip 414 spreads in an elliptical cone shape. However, the laser light and the metal thin plate 413 are prevented from interfering with each other by virtue of the notch 417 provided at the front surface 413b of the metal thin plate 413.

Although the end surface 416a of the submount 416 is inclined with respect to the end surfaces defining the notch 417 in the above embodiment, it is acceptable to place the submount 416 such that the end surface 416a of the submount 416 is parallel to one of the end surfaces of the notch 417.

Twelfth Embodiment

Figure 27A:
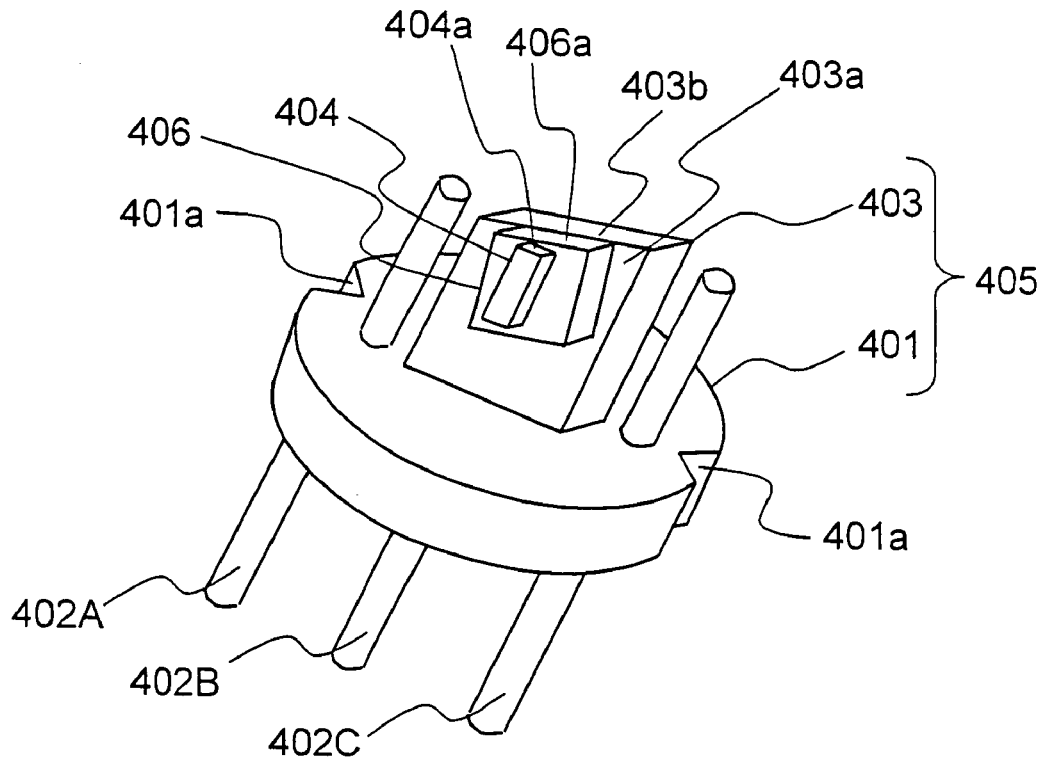
FIG. 27A is a schematic perspective view of a semiconductor laser device of a twelfth embodiment of the present invention.
Figure 27B:
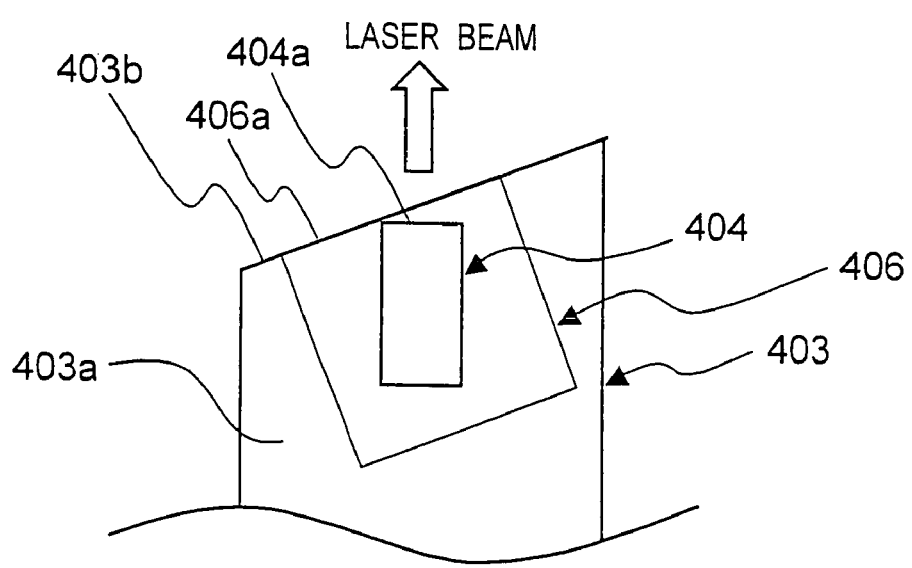
FIG. 27B is a schematic view of a metal support of the semiconductor laser device as viewed from the mounting surface side.

FIG. 27A schematically shows a perspective view of a semiconductor laser device of a twelfth embodiment of the present invention, and FIG. 27B schematically shows the metal support 403 as viewed from the mounting surface 403a side. In FIGS. 27A and 27B, same constituent parts as those of the tenth embodiment shown in FIGS. 25A and 25B are denoted by the same reference numerals as those of the constituent parts of FIGS. 25A and 25B.

The semiconductor laser device of the present embodiment differs from the tenth embodiment only in the direction in which the end surface 406a of the submount 406 is directed. That is, in the semiconductor laser device of the present embodiment, as shown in FIGS. 27A and 27B, the end surface 406a of the submount 406 is roughly parallel to the front surface 403b of the metal support 403.

The semiconductor laser device of the present embodiment produces an effect similar to that of the tenth embodiment. In addition, the semiconductor laser device of the present embodiment is configured such that the end surface 406a of the submount 406 is roughly parallel to the front surface 403b of the metal support 403. This allows the front surface 403b of the metal support 403 to be used as a mark for positioning the submount 406 when the submount 406 is placed on the metal support 403. Therefore, it becomes easy to position the submount 406.

Several embodiments of the present invention have been described above, and the present invention is not limited to the embodiments. Moreover, the ninth through twelfth embodiments may be properly combined with one another.

Thirteenth Embodiment

Figure 28:
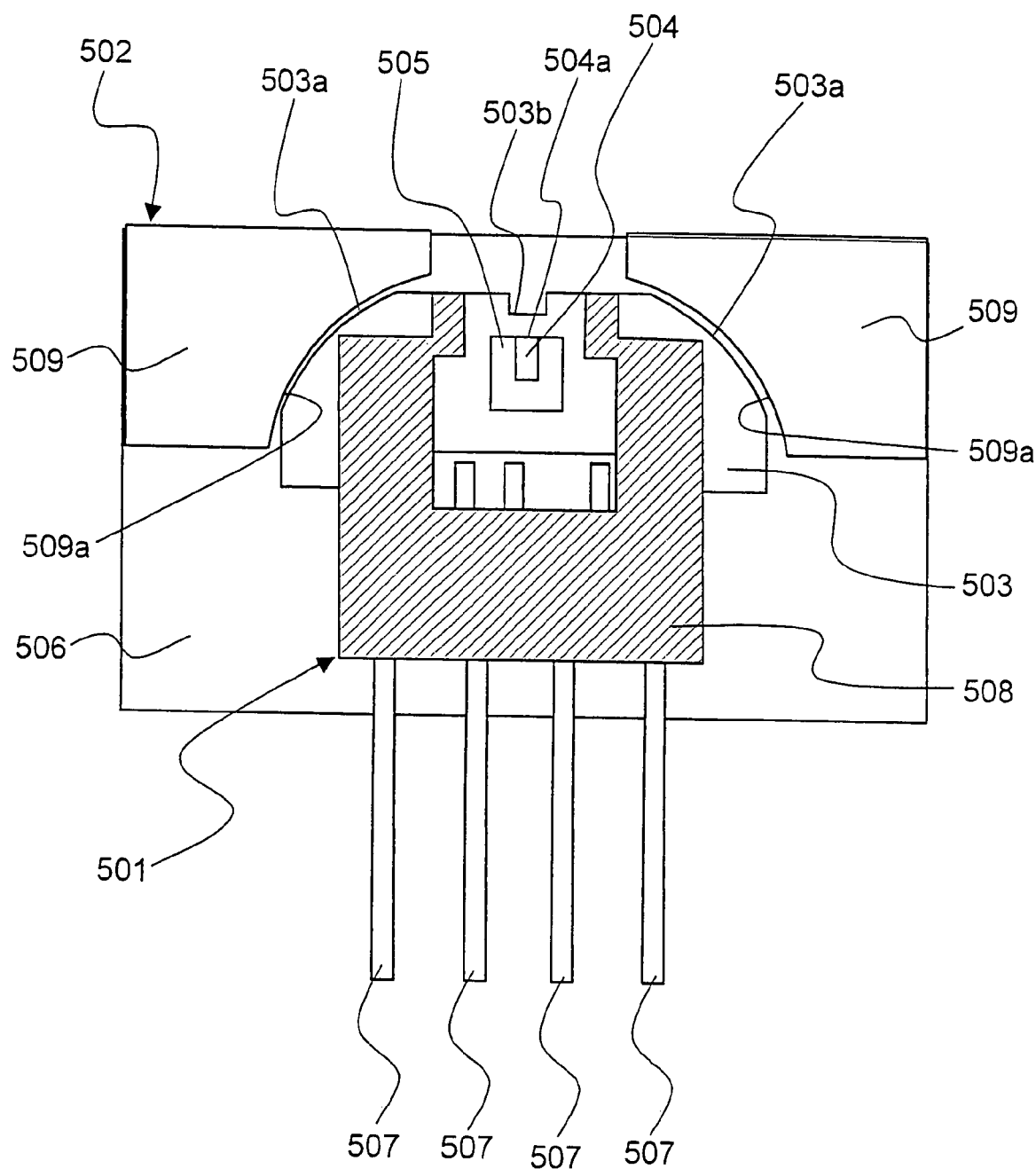
FIG. 28 is a schematic view of the top side (upper surface side) of a semiconductor laser device and a housing of a thirteenth embodiment of the present invention.

FIG. 28 shows a schematic view showing a semiconductor laser device 501 and a housing 502 of a thirteenth embodiment of the present invention, as viewed from the front surface side, the housing being a laser mounting portion included in a chassis of an optical pickup device. In this case, the chassis of the optical pickup device is provided with a collimating lens that transforms the light emitted from the laser chip (not shown) into approximate parallel light, an optical axis changing mirror, an object lens drive unit, and so on besides the semiconductor laser device, so that the chassis integrally retains the optical system of the optical pickup device.

The semiconductor laser device 501 has a thin metal plate 503 obtained by plating, for example, an iron plate or a copper plate of a thickness of about 0.3 mm with tin (Sn), gold (Au) or the like, and a laser chip 504 fixed to the surface of the thin metal plate 503 via a submount 505. A resin frame member 508 of a thickness of 3 mm integrated with the electrode lead 507 is provided on the surface of the thin metal plate 503. That is, the thin metal plate 503 is integrated with the resin frame 508 and the electrode lead 507. Moreover, the inner peripheral surfaces of the resin frame member 508 face both side surfaces and the back surface (surface opposite from the light-emitting end surface 504a) of the laser chip 504. The laser chip 504 has a cathode (upper surface) electrically connected to a lead 507 via a thin metal wire (e.g., Au wire of a diameter of 25 μm) (not shown). Moreover, the laser chip 504 has an anode electrically connected to an electrode on the submount 505 via a thin metal wire (not shown), and the electrode on the submount is electrically connected to the thin metal plate 503 (connected to one of the leads 507) via a thin metal wire (not shown). Moreover, curved portions 503a located beside the laser chip 504 and a cut 503b located ahead of the laser chip 504 are formed at the edge portion of the thin metal plate 503. The laser chip 504 is one example of the semiconductor laser chip. Moreover, the thin metal plate 503 and the resin frame 508 constitute one example of the main body.

The housing 502 includes a rectangular plate-like housing main body 506 and guide portions 509 which are provided on the housing main body 506 and which each have a contact surface 509a as one example of the curved surface. The curvature of the contact surface 509a is made approximately equal to the curvature of the associated curved portion 503a of the thin metal plate 503. Moreover, a surface of the housing main body 506 put in contact with the thin metal plate 503 is lower than a top surface of the guide portion 509. It is not always necessary to make the curvature of one curved portion 503a equal to the curvature of the other curved portion 503a. However, the center of curvature of each curved portion 503a should desirably be made approximately equal to the light-emitting point (the center of the front end surface (light-emitting end surface 504a)) of the laser chip 504. If the radius of curvature of one curved portion 503a is not equal to the radius of curvature of the other curved portion 503a, the laser chip 504 will be shifted toward the curved portion 503a of the smaller radius of curvature when viewed from above. Moreover, the number of light-emitting points of the laser chip 504 is not limited to one, and the number of laser chips 504 to be loaded is not limited to one. When a plurality of light-emitting points exist, the center of curvature of the curved portion 503a may be set at any one of the light-emitting point that serves as the center of adjustment. Alternatively, the light-emitting point that serves as the center may be changed according to the curvature of the curved portion 503a.

When the semiconductor laser device 501 is mounted on the housing 502, the curved portion 503a of the semiconductor laser device 501 is brought in contact with the contact surface 509a of the housing 502, and the semiconductor laser device 501 is slid with respect to the housing 502. By this operation, the thin metal plate 503 rotates while being supported by the contact surface 509a, and therefore, the optical axis of the outgoing beam of the laser chip 504 can easily be adjusted. Moreover, by setting the center of curvature of the curved portions 503a at the light-emitting point of the laser chip 504, the optical axis is prevented from being translated within a plane of the sheet of the drawing when the optical axis of the outgoing beam of the laser chip 504 is adjusted.

Fourteenth Embodiment

Figure 29:
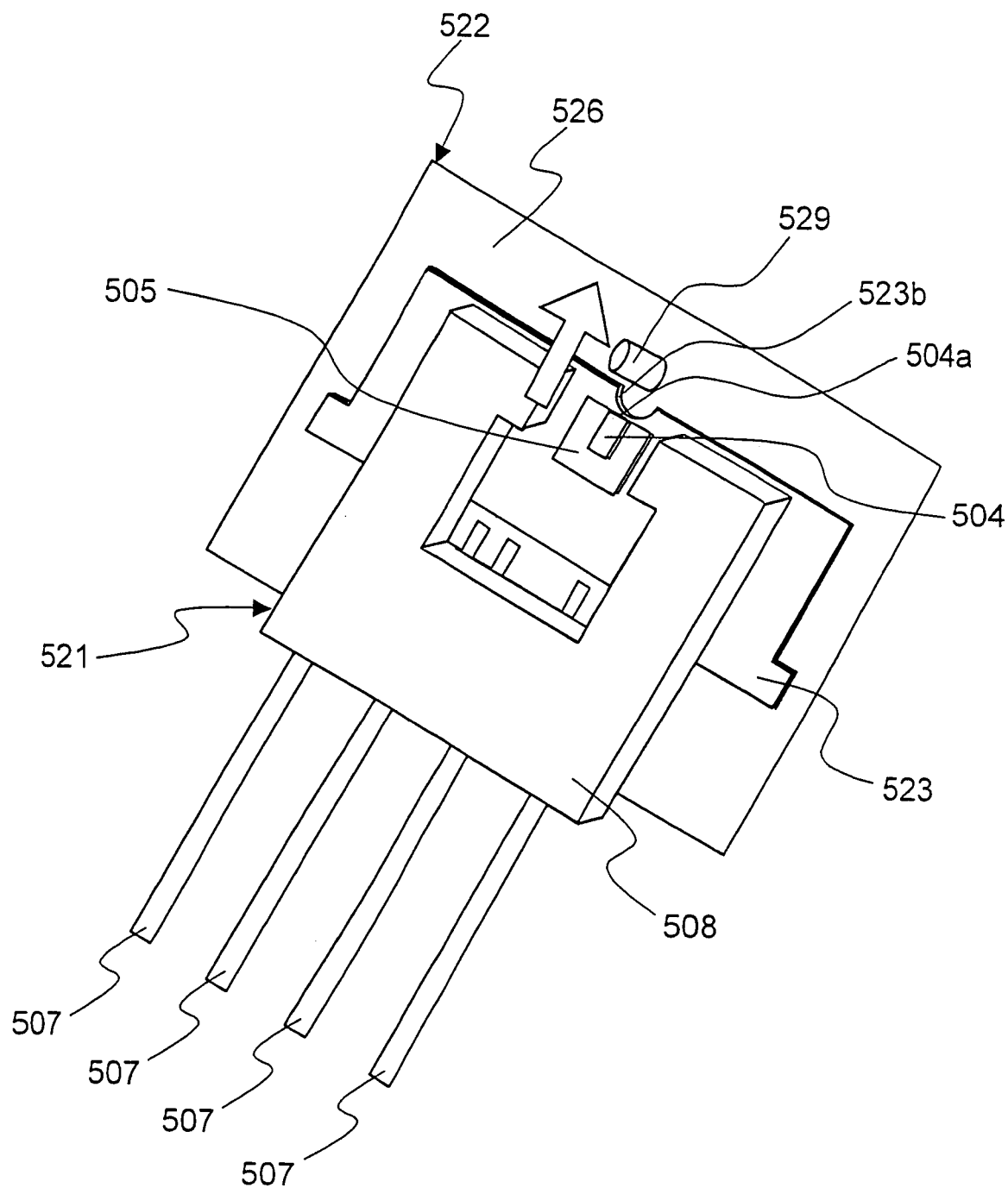
FIG. 29 is a schematic view of the top side (upper surface side) of a semiconductor laser device and a housing of a fourteenth embodiment of the present invention.

FIG. 29 shows a schematic view showing a semiconductor laser device 521 and a housing 522 according to a fourteenth embodiment of the present invention as viewed from the front surface side. In FIG. 29, same constituent parts as those of the thirteenth embodiment shown in FIG. 28 are denoted by the same reference numerals as the constituent parts of FIG. 28.

The semiconductor laser device 521 has a thin metal plate 523 and a laser chip 504 fixed to a surface of the thin metal plate 523 via a submount 505. A resin frame 508 integrated with electrode leads 507 is provided on the surface of the thin metal plate 523. That is, the thin metal plate 523 is integrated with the resin frame 508 and the electrode leads 507. Moreover, the inner peripheral surfaces of the resin frame member 508 face both side surfaces and the back surface (surface opposite from the light-emitting end surface 504a) of the laser chip 504. Moreover, a cut 523b is formed at an edge of the thin metal plate 523 such that the cut 523b is located ahead of the laser chip 504. That is, the cut 523b is located in the neighborhood of the light-emitting point of the laser chip 504. Moreover, the inner wall surface of the cut 523b is a cylindrical surface. The laser chip 504 is one example of the semiconductor laser chip. Moreover, the thin metal plate 523 and the resin frame 508 constitute one example of the main body of the laser device.

The housing 522 includes a rectangular plate-like housing main body 526 and a columnar projection 529 that is provided on a surface of the housing main body 526 and is engageable with the cut 523b.

When the semiconductor laser device 521 is mounted on the housing 522, the semiconductor laser device 521 is moved in the direction of arrow in the figure to engage the projection 529 of the housing 522 with the cut 523b of the semiconductor laser device 521, and the semiconductor laser device 521 is slid with respect to the housing 522. By this operation, the thin metal plate 523 rotates around the projection 529 in the neighborhood of the light-emitting point of the laser chip 504 while being supported by the projection 529, whereby the optical axis of the outgoing beam of the laser chip 504 can be adjusted.

Since the cut 523b is provided at the edge of the thin metal plate 503, the projection 529 can easily be engaged with the cut 523b by moving the semiconductor laser device 521 in the direction of arrow in the figure.

Figure 30:
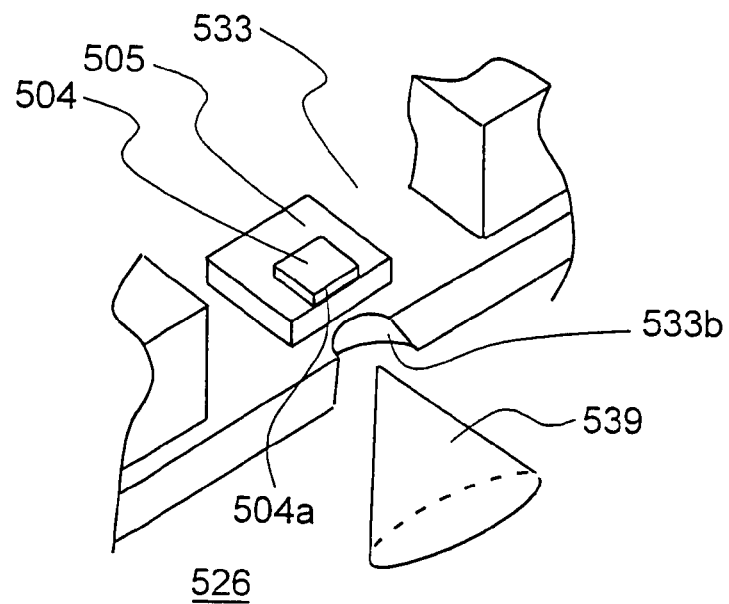
FIG. 30 is a schematic view for explaining a modification example of the semiconductor laser device and the housing of the fourteenth embodiment.

Although the columnar projection 529 is formed on the surface of the housing main body 526 in the fourteenth embodiment, it is acceptable to, alternatively, form a conical projection 539 on the surface of the housing main body 526 as shown in FIG. 30. When the conical projection 539 is formed, the thin metal plate 533 may be provided with a cut 533b whose inner wall surface is a conical surface. Desirably, the height of the columnar or conical projection may be set such that a top of the projection is lower than the light-emitting point of the laser chip 504, in order to prevent the laser light from impinging on the projection. The outgoing beam of the semiconductor laser 504 conically expands from the light-emitting point, the expansion being smaller as located nearer to the light-emitting point. Therefore, the conical shape is more desirable as the shape of the projection. Moreover, when the projection 539 is formed on the top surface of the housing main body 526, it is acceptable to provide a back surface of the thin metal plate 533 with a depression engageable with the projection 539 although not shown. When the depression engageable with the projection 539 is provided on the back surface of the thin metal plate 533, the semiconductor laser device 521 can easily be mounted on the surface of the housing main body 526 from above the housing 522.

Figure 31:
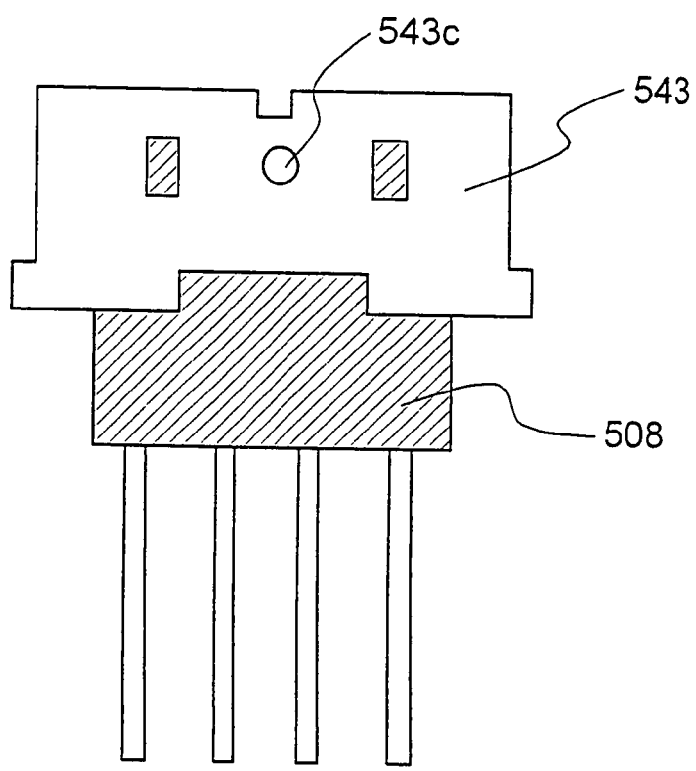
FIG. 31 is a schematic view for explaining a modification example of the semiconductor laser device of the fourteenth embodiment.

Although the cut 523b engageable with the columnar projection 529 is provided at the edge portion of the thin metal plate 523 in the fourteenth embodiment, it is acceptable to provide a depression 543c engageable with the columnar projection 529 on the back surface side of a thin metal plate 543 as shown in FIG. 31. The inner wall surface of the depression is a cylindrical surface. Moreover, the position of the depression 543c roughly coincides with the position of the light-emitting end surface 504a. That is, the depression 543c is located in the neighborhood of the light-emitting point of the laser chip 504.

Fifteenth Embodiment

Figure 32:
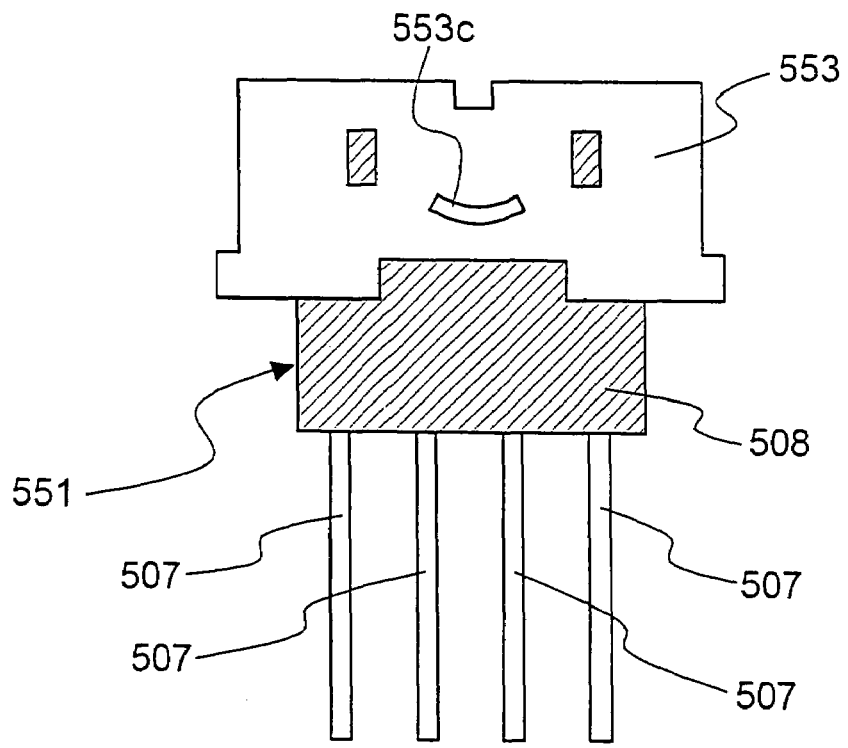
FIG. 32 is a schematic view of the back side (lower surface side) of a semiconductor laser device of a fifteenth embodiment of the present invention.
Figure 33:
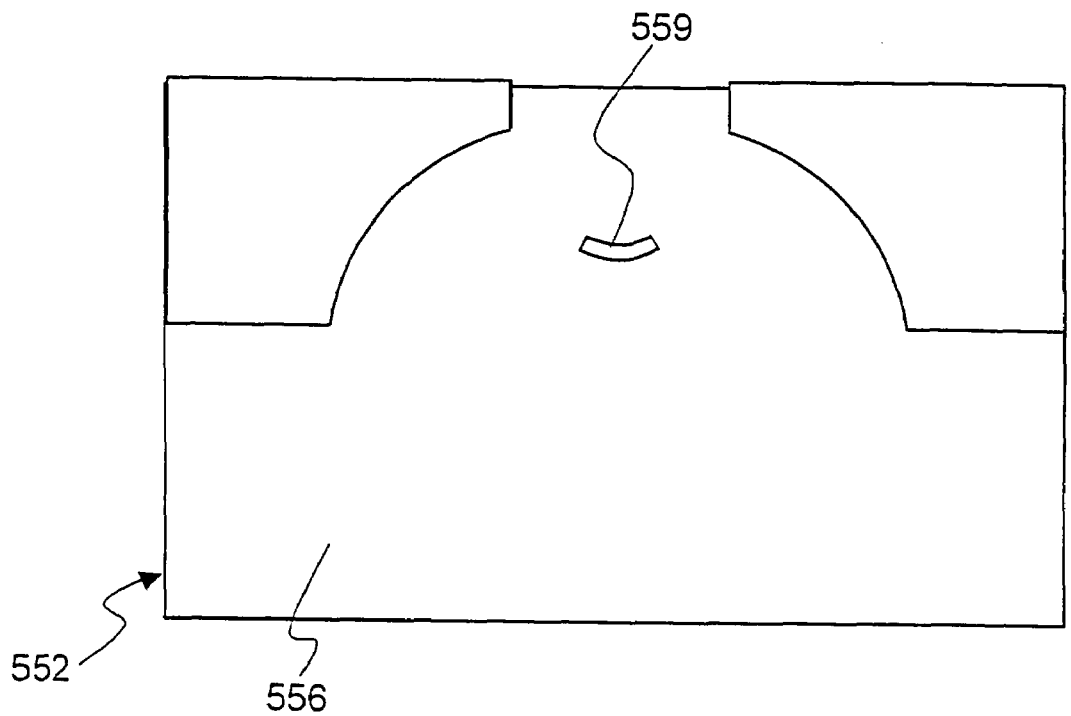
FIG. 33 is a schematic view of the top side (upper surface side) of the housing of the fifteenth embodiment of the present invention.

FIG. 32 shows a schematic view of a semiconductor laser device 551 according to a fifteenth embodiment of the present invention as viewed from the back surface side. FIG. 33 shows a housing 552 of the fifteenth embodiment of the present invention as viewed from the front surface side. In FIG. 32, same constituent parts as those of the thirteenth embodiment shown in FIG. 28 are denoted by the same reference numerals as the components of FIG. 28.

As shown in FIG. 32, the semiconductor laser device 551 has a thin metal plate 553, on the back surface of which a circular arc-shaped groove 553c (allowed to partway penetrate the thin metal plate 553) is provided. A laser chip 504 is fixed to the top surface of the thin metal plate 553 via a submount. The groove 553c is formed so as to roughly coincide with a circumference of a circle centered on the light-emitting point (the center of the front end surface (light-emitting end surface 504a)) of the laser chip 504. Moreover, a resin frame 508 integrated with electrode leads 507 is formed on a top surface of the thin metal plate 553. That is, the thin metal plate 553 is integrated with the resin frame 508 and the electrode leads 507.

As shown in FIG. 33, the housing 552 includes a housing main body 556 and a circular arc-shaped projection 559 that is provided on a top surface of the housing main body 556 and engageable with the groove 553c of the thin metal plate 553. The length in the circumferential direction of the projection 559 is shorter than the length in the circumferential direction of the groove 553c.

When the semiconductor laser device 551 is mounted on the housing 552, the projection 559 of the housing 522 is fit into the groove 553c of the semiconductor laser device 521, and the semiconductor laser device 521 is slid with respect to the housing 522. By this operation, the thin metal plate 553 rotates substantially around the light-emitting point of the laser chip 504 while being supported by the projection 559, whereby the optical axis of the outgoing beam of the semiconductor laser device 551 is adjusted.

Figure 34:
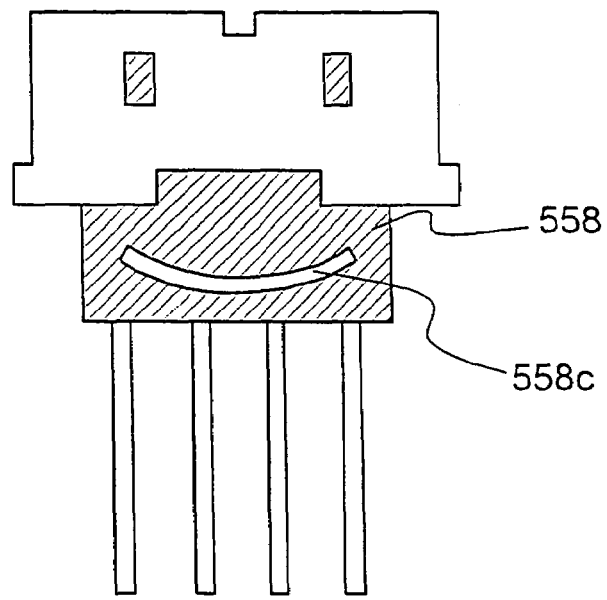
FIG. 34 is a schematic view for explaining a modification example of the semiconductor laser device of the fifteenth embodiment.

In the fifteenth embodiment, the groove 553c engageable with the circular arc-shaped projection 559 is formed at the back surface side of the thin metal plate 553. Alternatively, as shown in FIG. 34, a groove 558c engageable with the circular arc-shaped projection 559 may be formed at a back surface of a resin frame member 558 as one example of the resin member. The groove 558c is formed so as to roughly coincide with a circumference of a circle centered on the light-emitting point of the laser chip.

Figure 35:
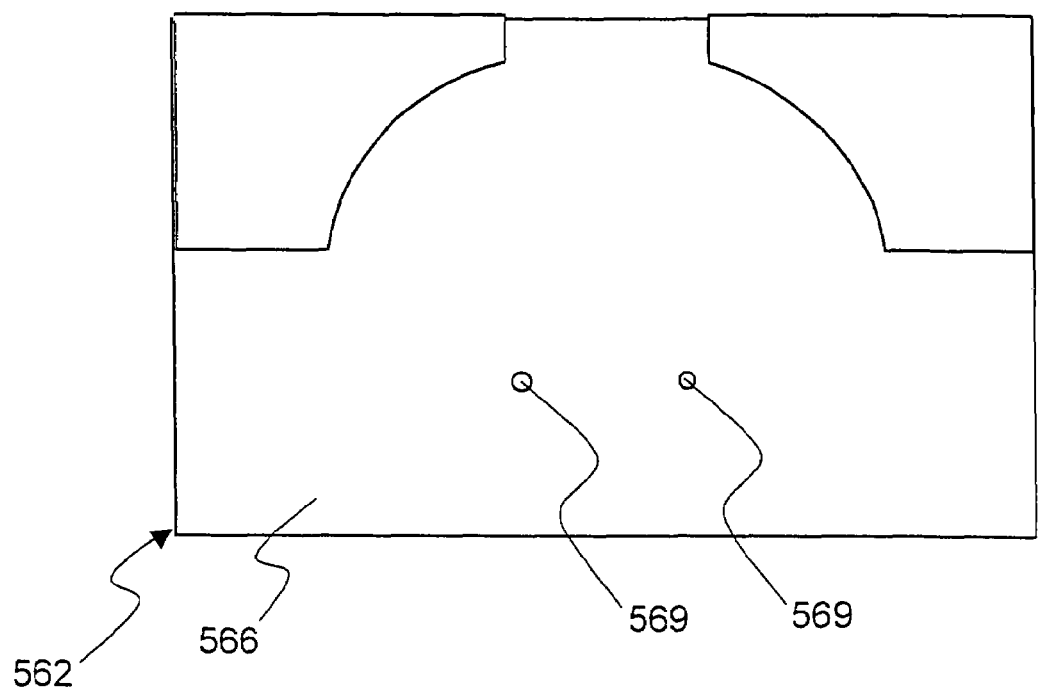
FIG. 35 is a schematic view for explaining a modification example of the housing of the fifteenth embodiment.

Also, in the fifteenth embodiment, one circular arc-shaped projection 559 fittable into the groove 553c of the thin metal plate 553 is formed on the top surface of the housing main body 556. Alternatively, as shown in FIG. 35, two columnar projections 569 may be formed on a top surface of a housing main body 566 of a housing 562.

Any one of the semiconductor laser devices described above and the associated housing may be incorporated in optical pickup devices.

In the thirteenth through fifteenth embodiments and the modification examples thereof, the semiconductor laser device is fixed to the housing with an adhesive such as a photosetting resin after the optical axis of the laser chip is adjusted.

Embodiments of the invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor laser device comprising:
   a first lead having a plate-like mounting portion on which a semiconductor laser chip is mounted and a lead portion extending from the mounting portion;
   a second lead extending along the lead portion of the first lead; and
   a retention portion made of an insulative material that integrally retains the first lead and the second lead, wherein the retention portion includes a frame member disposed on a semiconductor laser chip side of the first lead, and the frame member has a window portion for emitting laser light from the semiconductor laser chip;
   a cap to be fit in the frame member of the retention portion; and
   a pressure contact structure that urges the frame member of the retention portion against the cap, and vice versa, in a direction parallel to an optical axis of the semiconductor laser chip so as to bring the frame member and the cap in pressure contact with each other when the cap is fit in the frame member of the retention portion,
   wherein the cap has one or more projections that project in a direction parallel to the optical axis of the semiconductor laser chip,
   the frame member of the retention portion has one or more recess portions receding in the direction parallel to the optical axis of the semiconductor laser chip, and
   the pressure contact structure has said one or more projections and said one or more recess portions, and said or each projection is engaged with a corresponding recess portion while being brought in pressure contact therewith when the cap is attached to the frame member of the retention portion.

2. The semiconductor laser device as claimed in claim 1, wherein
   the cap has a projection engaged with the window portion of the frame member of the retention portion.

3. The semiconductor laser device as claimed in claim 1, wherein
   said or each projection has a hemispherical shape, and
   said or each recess portion has a shape complementary to the projection.

4. The semiconductor laser device as claimed in claim 1, wherein
   the cap has two opposite outer surfaces which extend in a direction perpendicular to the optical axis of the semiconductor laser chip,
   the frame member of the retention portion has two opposite inner surfaces which extend in the direction perpendicular to the optical axis of the semiconductor laser chip,
   the projections are provided at the two outer surfaces of the cap, two to outer surface, and
   the recess portions are provided at the two inner surfaces of the frame member of the retention portion, two to inner surface.

5. The semiconductor laser device as claimed in claim 1, wherein
   the cap has a handling lug.

6. The semiconductor laser device as claimed in claim 5, wherein
   the first lead has tie bar portions that project in opposite directions perpendicular to the optical axis of the semiconductor laser chip from respective opposite end edges of the mounting portion that are situated in the directions perpendicular to the optical axis of the semiconductor laser chip, and
   the lug of the cap is formed so as to be oriented in a direction parallel to the optical axis of the semiconductor laser chip when the cap is fit in the frame member of the retention portion.

7. The semiconductor laser device as claimed in claim 5, wherein
   the lug is defined between two lug-forming recess portions that are opposed to each other at an interval on one surface of the cap.

8. The semiconductor laser device as claimed in claim 7, wherein
   the lug-forming recess portions each have a crescentic shape.

9. The semiconductor laser device as claimed in claim 1, wherein
   the retention portion and the cap are made of an identical material.

10. The semiconductor laser device as claimed in claim 1, wherein
    the retention portion and the cap is made of a resin.

11. The semiconductor laser device as claimed in claim 1, wherein
    the retention portion and the cap have a black color.

* * * * *